(12) United States Patent
Hatakeyama

(10) Patent No.: US 6,869,744 B2
(45) Date of Patent: Mar. 22, 2005

(54) CHEMICALLY AMPLIFIED POSITIVE RESIST COMPOSITION

(75) Inventor: Jun Hatakeyama, Niigata-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 212 days.

(21) Appl. No.: 09/907,653

(22) Filed: Jul. 19, 2001

(65) Prior Publication Data

US 2002/0042017 A1 Apr. 11, 2002

(30) Foreign Application Priority Data

Jul. 19, 2000 (JP) .................................... 2000-218490

(51) Int. Cl.[7] .......................... G03F 7/038; G03F 7/20
(52) U.S. Cl. ................ 430/270.1; 430/296; 430/910; 430/919; 430/966
(58) Field of Search .......................... 430/270.1, 296, 430/966, 910, 919

(56) References Cited

U.S. PATENT DOCUMENTS

| | | | | | |
|---|---|---|---|---|---|
| 5,817,444 | A | * | 10/1998 | Sato et al. | 430/155 |
| 5,942,367 | A | * | 8/1999 | Watanabe et al. | 430/170 |
| 5,962,180 | A | * | 10/1999 | Iwanaga et al. | 430/170 |
| 5,985,512 | A | * | 11/1999 | Hatakeyama et al. | 430/270.1 |
| 6,156,481 | A | * | 12/2000 | Takeda et al. | 430/270.1 |
| 6,280,900 | B1 | * | 8/2001 | Chiba et al. | 430/270.1 |
| 6,444,394 | B1 | * | 9/2002 | Sato et al. | 430/270.1 |
| 6,627,379 | B2 | * | 9/2003 | Kim et al. | 430/270.1 |
| 2001/0035394 | A1 | * | 11/2001 | Takeda et al. | 216/41 |
| 2001/0055727 | A1 | * | 12/2001 | Kubota et al. | 430/270.1 |
| 2003/0120107 | A1 | * | 6/2003 | Yamamoto et al. | 560/220 |

FOREIGN PATENT DOCUMENTS

JP        11-15163        1/1999

OTHER PUBLICATIONS

Abstract of Japanese Patent 11–15163.

* cited by examiner

Primary Examiner—Yvette C. Thornton
(74) Attorney, Agent, or Firm—Millen White Zelano & Branigan, P.C.

(57) ABSTRACT

A chemically amplified positive resist composition contains as a base a carboxyl or phenolic hydroxyl group-containing resin soluble in aqueous alkaline solution, in which acid labile groups are incorporated into at least some of the hydrogen atoms on the carboxyl or phenolic hydroxyl groups so that the resin becomes insoluble or substantially insoluble in alkali, wherein the resin contains acid labile groups of at least two types, acid labile groups of one type are acetal or ketal groups, and acid labile groups of the other type are tertiary hydrocarbon groups or tertiary hydrocarbon group-containing substituents. The resist composition remains stable during vacuum standing after exposure to electron beams or soft x-rays, leaves minimal footings on chromium substrates, has an excellent sensitivity and resolution, and is thus suited as a micropatterning material for use in the processing of mask substrates.

5 Claims, No Drawings

CHEMICALLY AMPLIFIED POSITIVE RESIST COMPOSITION

This invention relates to a chemically amplified positive resist composition suitable for micropatterning using electron beams or soft x-rays, which experiences a minimized change of sensitivity during vacuum standing after exposure and exhibits minimized footing on chromium substrates.

BACKGROUND OF THE INVENTION

Progress in the production of integrated circuits employing large scale integration and high operating speeds has been characterized by an ever decreasing pattern rule. It was expected in the "National Technology Roadmap for Semiconductors" (Semiconductor Industry Association, 1994) that the mass scale production of 0.18-$\mu$m rule devices would start from 2001. Actually, the production started in 1999, two years earlier than expected. For the production of 0.18-$\mu$m devices, ArF lithography was believed promising, but KrF lithography has been prolonged. KrF lithography is contemplated for the mass-scale production of 0.15-$\mu$m devices now and even 0.13-$\mu$m devices under future consideration. The mature KrF lithography accelerates microfabrication toward an ever decreasing feature size.

In these years, engineers also place a focus on the mask production technology. From the era of g-line and i-line reducing projection stepper have been used, with their reduction ratio of 1/5. Recently, a reduction ratio of 1/4 is employed in conjunction with the enlargement of chip size and the increasing aperture of projection lens. Not only a reduction in line width as a result of progress of micropatterning, but also a reduction in line width as a result of magnification change pose a serious problem to the mask production technology.

The exposure system for use in mask production has been changed from a laser beam exposure system to an electron beam exposure system in order to increase the line width accuracy. Since definition of a finer feature size becomes possible by increasing the acceleration voltage in an electron gun in the system, the acceleration voltage has increased from 10 keV to 30 keV. An acceleration voltage of 50 keV now becomes mainstream.

In conjunction with the increasing acceleration voltage, a lowering of resist sensitivity becomes a problem. As the acceleration voltage increases, the influence of forward scattering within the resist film is reduced so that the contrast of electron writing energy is improved, resulting in improvements in resolution and dimensional control. However, since such electrons can penetrate straight through the resist film, the sensitivity of the resist lowers. Since the mask exposure system carries out exposure by direct writing along a continuous stroke, the lowering of resist sensitivity undesirably leads to a lowering of productivity.

To meet the demand for higher sensitivity, chemical amplification type resists are now under consideration. However, there arises a problem that the sensitivity varies during vacuum standing after exposure. In particular, positive resists suffer from the problem of a footing profile on chromium substrates.

When resist film is allowed to stand in vacuum for a long time after exposure, the acid generated by exposure evaporates. If the acid evaporates before progress of elimination reaction, the resist becomes low sensitive. Even when postexposure baking (PEB) is effected in dry air, nitrogen or argon, the heat treatment before progress of elimination reaction causes the acid to evaporate, resulting in a lower sensitivity.

It is believed that footing on substrates is the same phenomenon as the problem that KrF lithography encounters on basic substrates such as TiN. It is effective for alleviating the footing phenomenon to use acetal and other acid labile substituent groups having low activation energy in elimination reaction. For resists using acetal substituents, however, a phenomenon that sensitivity gradually lowers during vacuum standing after exposure was observed. In the presence of moisture, acetal groups undergo acid-catalyzed elimination reaction in a substantially irreversible manner. In the absence of moisture, however, the elimination reaction becomes reversible. Since the rate of reverse reaction is high, the apparent rate of elimination reaction is very low.

One effective means for preventing irreversible reaction of acetal in the absence of moisture is by adding high-boiling alcohols as disclosed in Hatakeyama et al, JP-A 11-15163. High-boiling alcohol is left within the resist film after pre-baking or during vacuum standing and functions to induce irreversible elimination reaction as does water. However, if the elimination reaction in vacuum becomes irreversible by the addition of alcohol, the elimination reaction proceeds during vacuum standing, resulting in a higher sensitivity. A mere combination of acetal groups with alcohol additives was difficult to enhance the stability in vacuum.

SUMMARY OF THE INVENTION

An object of the invention is to provide a chemically amplified positive resist composition suited for exposure to electron beams or soft x-rays, which experiences a minimized change of sensitivity during vacuum standing after exposure and leaves minimized footing on chromium substrates.

Elimination reaction of acetal substituents in the absence of water is shown by scheme (a)-1, and that in the presence of water is shown by scheme (a)-2. Similar phenomena are reproduced when exposure to electron beams or soft x-rays is followed by baking (post-exposure baking, PEB) in an atmosphere of dry air having a humidity of less than about 20%, nitrogen, argon or helium.

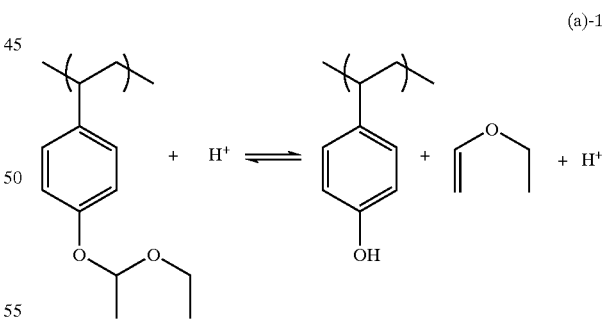

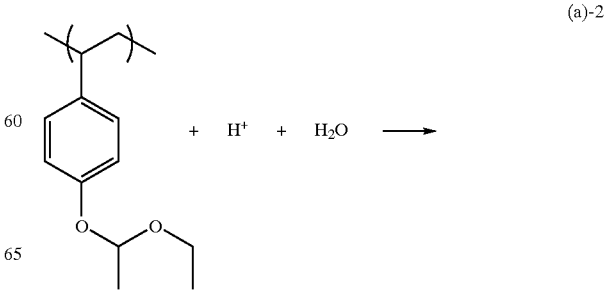

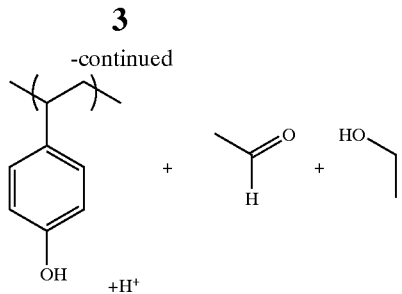

On the other hand, substituent groups obtained by substituting the hydroxyl group of a carboxylic acid or phenol with a tertiary hydrocarbon group allow elimination to take place even in the absence of water. This reaction is shown by scheme (b).

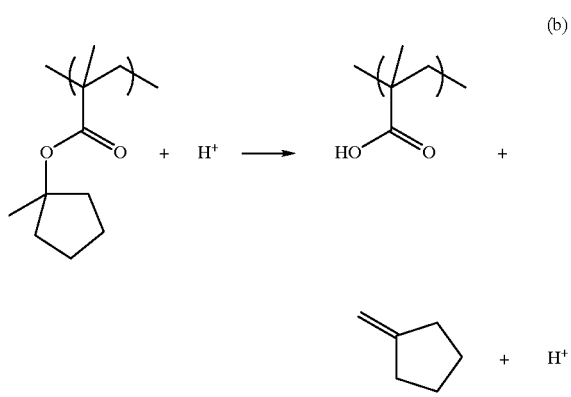

Empirical results demonstrate that of tertiary hydrocarbon-substituted groups, those groups having high elimination reactivity allow elimination reaction to proceed during vacuum standing after exposure. As opposed to acetal, this results in a higher sensitivity. Then a combination of acetal groups with tertiary hydrocarbon groups having high elimination reactivity can improve the stability of vacuum standing after exposure by compensating for the respective drawbacks. Also, tertiary hydrocarbon groups having high elimination reactivity leave minimal footings in proximity to substrates, and a combination thereof with acetal groups can further suppress the footing on substrates.

Herein, tertiary hydrocarbon groups should have high elimination reactivity and low activation energy of elimination. In the case of substituents having high activation energy, the stability of sensitivity is high because elimination does not proceed during vacuum standing, but footing occurs. An attempt to combine them with acetal groups in order to restrain the footing effect fails to prevent sensitivity lowering by the acetal groups.

It has been empirically found that among tertiary hydrocarbon groups, only those groups having higher elimination reactivity than the tert-butyl group can satisfy the above-described function. An effective method for enhancing elimination reactivity beyond tert-butyl groups is by increasing the electron density of tertiary carbon, and especially increasing the potential formation of olefin resulting from elimination accompanied by ring formation. For example, a tert-amyl group which is lengthened by only one carbon is more reactive than the tert-butyl group, and groups having a ring structure or aryl group are effectively improved in reactivity.

Therefore, the invention provides a chemically amplified positive resist composition for exposure to electron beams or soft x-rays, comprising as a base polymer at least one carboxyl or phenolic hydroxyl group-containing resin soluble in aqueous alkaline solution, in which acid labile groups are incorporated into at least some of the hydrogen atoms on the carboxvl or Phenolic hydroxyl groups so that the resin becomes insoluble or substantially insoluble in alkali. The resin contains acid labile groups of at least two types, acid labile groups of one type are acetal or ketal groups of the following general formula (1)-1, (1)-2 or (1)-3, and acid labile groups of the other type are tertiary hydrocarbon groups of the following general formula (2)-1 or (2)-2 or tertiary hydrocarbon group-containing substituents of the following general formula

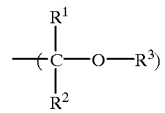

(1)-1

Herein $R^1$ and $R^2$ each are hydrogen or a straight, branched or cyclic alkyl group of 1 to 20 carbon atoms, which may contain a hetero atom such as oxygen, sulfur, nitrogen or fluorine, $R^3$ is a straight, branched or cyclic alkyl group of 1 to 20 carbon atoms or aryl or aralkyl group of 6 to 20 carbon atoms, which may contain a hetero atom such as oxygen, sulfur, nitrogen or fluorine, or a pair of $R^1$ and $R^2$, $R^1$ and $R^3$, or $R^2$ and $R^3$, taken together, may form a ring.

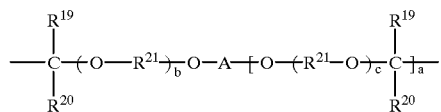

(1)-2

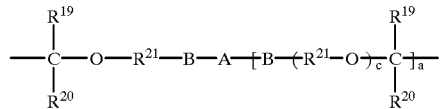

(1)-3

Herein $R^{19}$ and $R^{20}$ each are hydrogen or a straight, branched or cyclic alkyl group of 1 to 8 carbon atoms, or $R^{19}$ and $R^{20}$, taken together, may form a ring, and $R^{19}$ and $R^{20}$ are straight or branched alkylene groups of 1 to 8 carbon atoms when they form a ring; $R^{21}$ is a straight, branched or cyclic alkylene group of 1 to 10 carbon atoms; "b" and "c" are 0 or integers of 1 to 10; A is a (a+1)-valent aliphatic or alicyclic saturated hydrocarbon group, aromatic hydrocarbon group or heterocyclic group having 1 to 50 carbon atoms, which may be separated by a hetero atom or in which some of the hydrogen atoms attached to carbon atoms may be substituted with hydroxyl, carboxyl, carbonyl or fluorine; B is —CO—O—, —NHCO—O— or —NHCONH—, and "a" is an integer of 1 to 7.

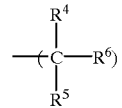

(2)-1

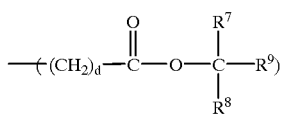
(3)-1

Herein R⁴ to R⁹ each are a straight, branched or cyclic alkyl group of 1 to 20 carbon atoms or aryl group of 6 to 20 carbon atoms, at least one of $R^4$, $R^5$ and $R^6$ and at least one of $R^7$, $R^8$ and $R^9$ are cyclic alkyl groups of 5 to 20 carbon atoms or aryl groups of 6 to 20 carbon atoms, which may contain a hetero atom such as oxygen, sulfur, nitrogen or fluorine, or $R^4$, $R^5$ and $R^6$, and $R^7$, $R^8$ and $R^9$, taken together, may form a ring of 5 to 30 carbon atoms, which may contain a hetero atom such as oxygen, sulfur, nitrogen or fluorine, the total number of carbon atoms in $R^4$, $R^5$ and $R^6$ and the total number of carbon atoms in $R^7$, $R^8$ and $R^9$ each are in the range of 6 to 30, and "d" is an integer of 0 to 4.

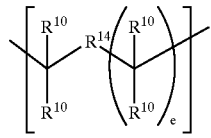
(2)-2

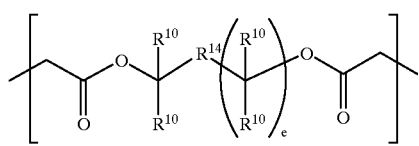
(3)-2

Herein $R^{10}$ and $R^{14}$ each are a straight, branched or cyclic alkyl group of 1 to 20 carbon atoms or aryl group of 6 to 20 carbon atoms, either one of $R^{10}$ and $R^{14}$ is a cyclic alkyl group of 5 to 20 carbon atoms or aryl group of 6 to 20 carbon atoms, which may contain a hetero atom such as oxygen, sulfur, nitrogen or fluorine, and "e" is an integer of 1 to 3.

In one preferred embodiment, the resist composition contains (A) a carboxyl or phenolic hydroxyl group-containing resin soluble in aqueous alkaline solution, having acid labile groups incorporated therein by substituting acetal or ketal groups of the formula (1)-1, (1)-2 or (1)-3 for at least some of the hydrogen atoms on the carboxyl or phenolic hydroxyl groups so that the resin becomes insoluble or substantially insoluble in alkali, and (B) another carboxyl or phenolic hydroxyl group-containing resin soluble in an aqueous alkaline solution, having acid labile groups incorporated therein by substituting tertiary hydrocarbon groups of the formula (2)-1 or (2)-2 or tertiary hydrocarbon group-containing substituents of the formula (3)-1 or (3)-2 for at least some of the hydrogen atoms on the carboxyl or phenolic hydroxyl groups so that the resin becomes insoluble or substantially insoluble in alkali.

In another preferred embodiment, the resist composition contains a carboxyl or phenolic hydroxyl group-containing resin soluble in aqueous alkaline solution, having acid labile groups of at least two types incorporated therein so that the resin becomes insoluble or substantially insoluble in alkali. The acid labile groups of at least two types include acid labile groups obtained by substituting acetal or ketal groups of the formula (1)-1, (1)-2 or (1)-3 for some of the hydrogen atoms on the carboxyl or phenolic hydroxyl groups and acid labile groups obtained by substituting tertiary hydrocarbon groups of the formula (2)-1 or (2)-2 or tertiary hydrocarbon group-containing substituents of the formula (3)-1 or (3)-2 for at least some of the remaining hydrogen atoms.

In any of the above embodiments, the resist composition may further contain an organic solvent and a photoacid generator. There may be further blended a basic compound and/or a dissolution inhibitor.

DESCRIPTION OF THE PREFERRED EMBODIMENT

The chemically amplified resist composition of the invention is suited for exposure to electron beams or soft x-rays, acts in a positive manner, and contains as a base polymer one or more carboxyl or phenolic hydroxyl group-containing resins soluble in aqueous alkaline solution, in which acid labile groups are incorporated into at least some of the hydrogen atoms on the carboxyl or phenolic hydroxyl groups so that the resin becomes insoluble or substantially insoluble in alkali. The resin contains acid labile groups of at least two types. Acid labile groups of one type are first acid labile groups substituted with acetal or ketal groups of the following general formula (1)-1, (1)-2 or (1)-3. Acid labile groups of the other type are second acid labile groups substituted with tertiary hydrocarbon groups of the following general formula (2)-1 or (2)-2 or tertiary hydrocarbon group-containing substituents of the following general formula (3)-1 or (3)-2.

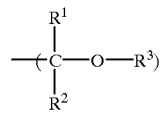
(1)-1

Herein $R^1$ and $R^2$ each are hydrogen or a straight, branched or cyclic alkyl group of 1 to 20 carbon atoms, which may contain a hetero atom such as oxygen, sulfur, nitrogen or fluorine, $R^3$ is a straight, branched or cyclic alkyl group of 1 to 20 carbon atoms or aryl or aralkyl group of 6 to 20 carbon atoms, which may contain a hetero atom such as oxygen, sulfur, nitrogen or fluorine, or a pair of $R^1$ and $R^2$, a pair of $R^1$ and $R^3$, or a pair of $R^2$ and $R^3$, taken together, may form a ring.

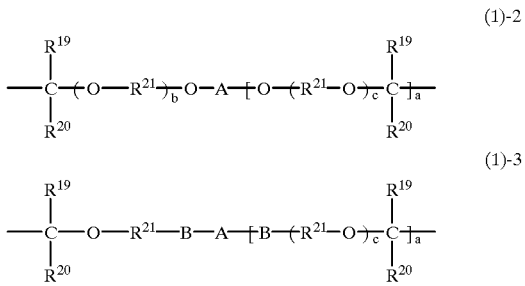

Herein $R^{19}$ and $R^{20}$ each are hydrogen or a straight, branched or cyclic alkyl group of 1 to 8 carbon atoms, or $R^{19}$ and $R^{20}$, taken together, may form a ring, and $R^{19}$ and $R^{20}$ are straight or branched alkylene groups of 1 to 8 carbon atoms when they form a ring; $R^{21}$ is a straight, branched or cyclic alkylene group of 1 to 10 carbon atoms; "b" and "c" are 0 or integers of 1 to 10; A is a (a+1)-valent aliphatic or alicyclic saturated hydrocarbon group, aromatic hydrocarbon group or heterocyclic group having 1 to 50 carbon atoms, which may be separated by a hetero atom or in which some of the hydrogen atoms attached to carbon atoms may be substituted with hydroxyl, carboxyl, carbonyl or fluorine; B is —CO—O—, —NHCO—O— or —NHCONH—, and "a" is an integer of 1 to 7.

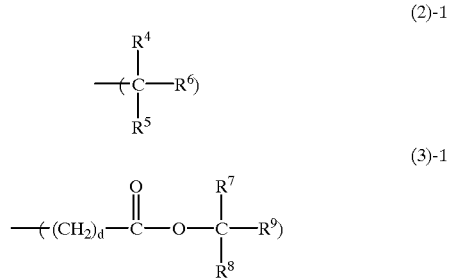

Herein $R^4$ to $R^9$ each are a straight, branched or cyclic alkyl group of 1 to 20 carbon atoms or aryl group of 6 to 20 carbon atoms, at least one of $R^4$, $R^5$ and $R^6$ and at least one of $R^7$, $R^8$ and $R^9$ are cyclic alkyl groups of 5 to 20 carbon atoms or aryl groups of 6 to 20 carbon atoms, which may contain a hetero atom such as oxygen, sulfur, nitrogen or fluorine, or $R^4$, $R^5$ and $R^6$, and $R^7$, $R^8$ and $R^9$, taken together, may form a ring of 5 to 30 carbon atoms, which may contain a hetero atom such as oxygen, sulfur, nitrogen or fluorine, the total number of carbon atoms in $R^4$, $R^5$ and $R^6$ and the total number of carbon atoms in $R^7$, $R^8$ and $R^9$ each are in the range of 6 to 30, and "d" is an integer of 0 to 4.

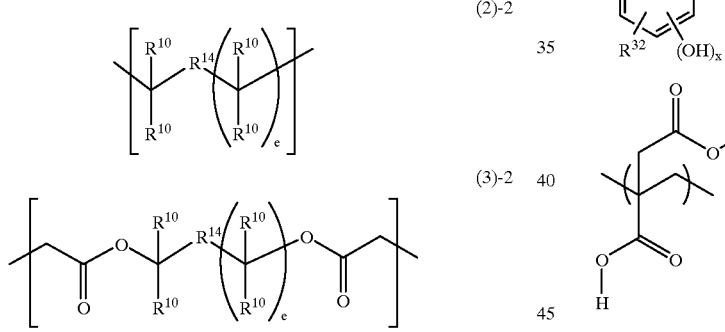

Herein $R^{10}$ and $R^{14}$ each are a straight, branched or cyclic alkyl group of 1 to 20 carbon atoms or aryl group of 6 to 20 carbon atoms, either one of $R^{10}$ and $R^{14}$ is a cyclic alkyl group of 5 to 20 carbon atoms or aryl group of 6 to 20 carbon atoms, which may contain a hetero atom such as oxygen, sulfur, nitrogen or fluorine, and "e" is an integer of 1 to 3.

In the resist composition of the invention, the alkali insoluble or substantially alkali insoluble resin becomes a base resin. The resin may be a mixture of an alkali insoluble or substantially alkali insoluble resin having the first acid labile groups and an alkali insoluble or substantially alkali insoluble resin having the second acid labile groups; that is, a mixture of a carboxyl or phenolic hydroxyl group-containing resin soluble in aqueous alkaline solution, having first acid labile groups incorporated therein by substituting acetal or ketal groups of the formula (1)-1, (1)-2 or (1)-3 for at least some of the hydrogen atoms on the carboxyl or phenolic hydroxyl groups so that the resin becomes insoluble or substantially insoluble in alkali, and another carboxyl or phenolic hydroxyl group-containing resin soluble in an aqueous alkaline solution, having second acid labile groups incorporated therein by substituting tertiary hydrocarbon groups or tertiary hydrocarbon group-containing substituents of the formula (2)-1, (2)-2, (3)-1 or (3)-2 for at least some of the hydrogen atoms on the carboxyl or phenolic hydroxyl groups so that the resin becomes insoluble or substantially insoluble in alkali. In an alternative embodiment, the resin is an alkali insoluble or substantially alkali insoluble resin having the first acid labile groups and the second acid labile groups in a molecule; that is, a carboxyl or phenolic hydroxyl group-containing resin soluble in aqueous alkaline solution, having acid labile groups of at least two types incorporated therein so that the resin becomes insoluble or substantially insoluble in alkali, wherein the acid labile groups of at least two types include first acid labile groups obtained by substituting acetal or ketal groups of the formula (1)-1, (1)-2 or (1)-3 for some of the hydrogen atoms on the carboxyl or phenolic hydroxyl groups and second acid labile groups obtained by substituting tertiary hydrocarbon groups or tertiary hydrocarbon group-containing substituents of the formula (2)-1, (2)-2, (3)-1 or (3)-2 for at least some of the remaining hydrogen atoms.

The base polymer soluble in aqueous alkaline solution is preferably one comprising one or more of the following units.

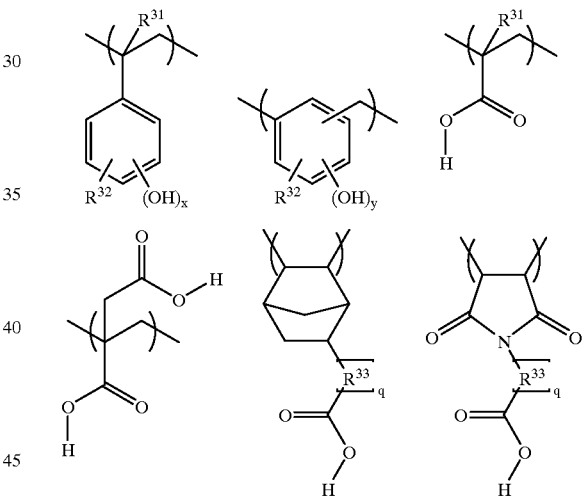

Herein $R^{31}$ and $R^{32}$ each are hydrogen or a straight, branched or cyclic alkyl or fluorinated alkyl group of 1 to carbon atoms; $R^{33}$ is a straight, branched or cyclic alkylene group of 1 to 10 carbon atoms which may contain an oxygen atom in the form of a hydroxy, acetyl, ester, ether or similar group; x is an integer of 1 to 4, y is an integer of 1 to 3, p and q are equal to 0 or 1.

In addition to the above-described units, the base polymer soluble in aqueous alkaline solution may have copolymerized therein a monomer selected from among acrylic acid derivatives, methacrylic acid derivatives, norbornene derivatives, maleic anhydride, maleimide, acrylonitrile, vinyl acetate, vinyl alcohol and tetrafluoroethylene. Preferably the base polymer has a weight average molecular weight in the range of about 2,000 to about 100,000.

Also the base polymer soluble in aqueous alkaline solution may be a dendritic polymer or hyperbranched polymer comprising recurring units of the following formulae (I) and (II).

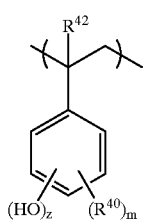

(I)

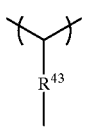

(II)

Herein, $R^{40}$ is hydrogen, a straight, branched or cyclic alkyl group of 1 to 20 carbon atoms or aryl group of 6 to 20 carbon atoms; $R^{42}$ is hydrogen or a straight, branched or cyclic alkyl group of 1 to 6 carbon atoms; $R^{43}$ is a straight, branched or cyclic alkylene group of 1 to 20 carbon atoms or arylene group of 6 to 20 carbon atoms, which may contain an ether bond or ester bond; z is an integer of 1 to 5, m is an integer of 1 to 5, and $z+m \leq 5$.

The alkali insoluble or substantially alkali insoluble resin used herein is the aforementioned alkali-soluble resin having carboxyl or phenolic hydroxyl groups, at least some of which are substituted with acid labile groups, typically the aforementioned first and second acid labile groups.

The first acid labile groups have the following general formulae (1)-1, (1)-2 and (1)-3.

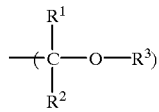

(1)-1

Herein $R^1$ and $R^2$ each are hydrogen or a straight, branched or cyclic alkyl group of 1 to 20 carbon atoms, which may contain a hetero atom such as oxygen, sulfur, nitrogen or fluorine. $R^3$ is a straight, branched or cyclic alkyl group of 1 to 20 carbon atoms or aryl or aralkyl group of 6 to 20 carbon atoms, which may contain a hetero atom such as oxygen, sulfur, nitrogen or fluorine. A pair of $R^1$ and $R^2$, a pair of $R^1$ and $R^3$, or a pair of $R^2$ and $R^3$, taken together, may form a ring.

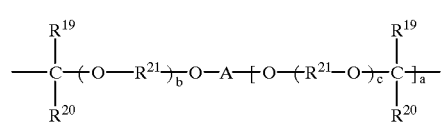

(1)-2

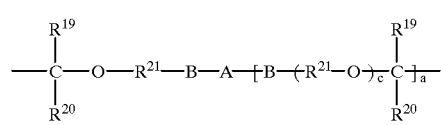

(1)-3

Herein $R^{19}$ and $R^{20}$ each are hydrogen or a straight, branched or cyclic alkyl group of 1 to 8 carbon atoms, or $R^{19}$ and $R^{20}$, taken together, may form a ring, and $R^{19}$ and $R^{20}$ are straight or branched alkylene groups of 1 to 8 carbon atoms when they form a ring. $R^{21}$ is a straight, branched or cyclic alkylene group of 1 to 10 carbon atoms. Letters "b" and "c" are 0 or integers of 1 to 10. A is a (a+1)-valent aliphatic or alicyclic saturated hydrocarbon group, aromatic hydrocarbon group or heterocyclic group having 1 to 50 carbon atoms, which may be separated by a hetero atom or in which some of the hydrogen atoms attached to carbon atoms may be substituted with hydroxyl, carboxyl, carbonyl or fluorine. B is —CO—O—, —NHCO—O— or —NHCONH—. Letter "a" is an integer of 1 to 7.

Referring to formula (1)-1, examples of the alkyl groups represented by $R^1$, $R^2$ and $R^3$ include methyl, ethyl, propyl, isopropyl, n-butyl, sec-butyl, tert-butyl, cyclopentyl, cyclohexyl, 2-ethylhexyl and n-octyl. Some or all of the hydrogen atoms on these alkyl groups may be substituted with fluorine atoms. Further, some of the hydrogen atoms on these alkyl groups may be substituted with hydroxyl, alkoxy, oxo, amino, alkylamino and other groups. Illustrative examples of substituted alkyl groups are given below.

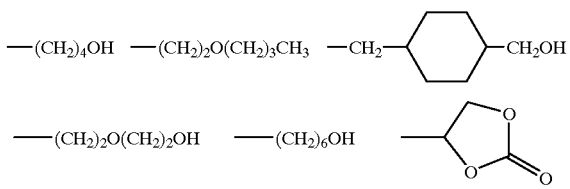

A pair of $R^1$ and $R^2$, a pair of $R^1$ and $R^3$, or a pair of $R^2$ and $R^3$, taken together, may form a ring. Each of $R^1$, $R^2$ and $R^3$ is a straight or branched alkylene group of 1 to 18 carbon atoms, preferably 1 to 10 carbon atoms when they form a ring. Examples of the alkylene group include methylene, ethylene, propylene, isopropylene, n-butylene, isobutylene, cyclohexylene and cyclopentylene.

Examples of the aryl group represented by $R^3$ include phenyl, methylphenyl, naphthyl, anthryl, phenanthryl and pyrenyl.

Illustrative acetal groups are exemplified below by formulae (6)-1 through (6)-29.

(6)-1

(6)-2

(6)-3

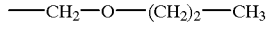

(6)-4

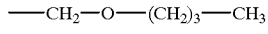

(6)-5

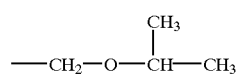

(6)-6

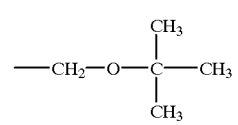

(6)-7

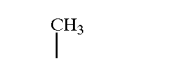

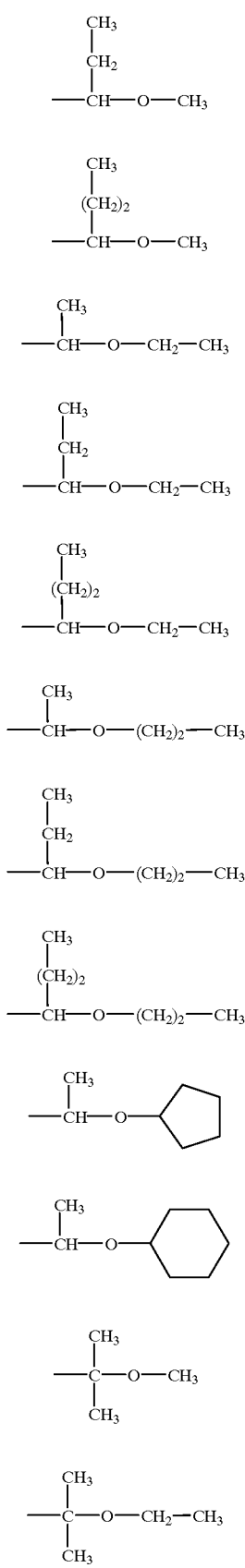

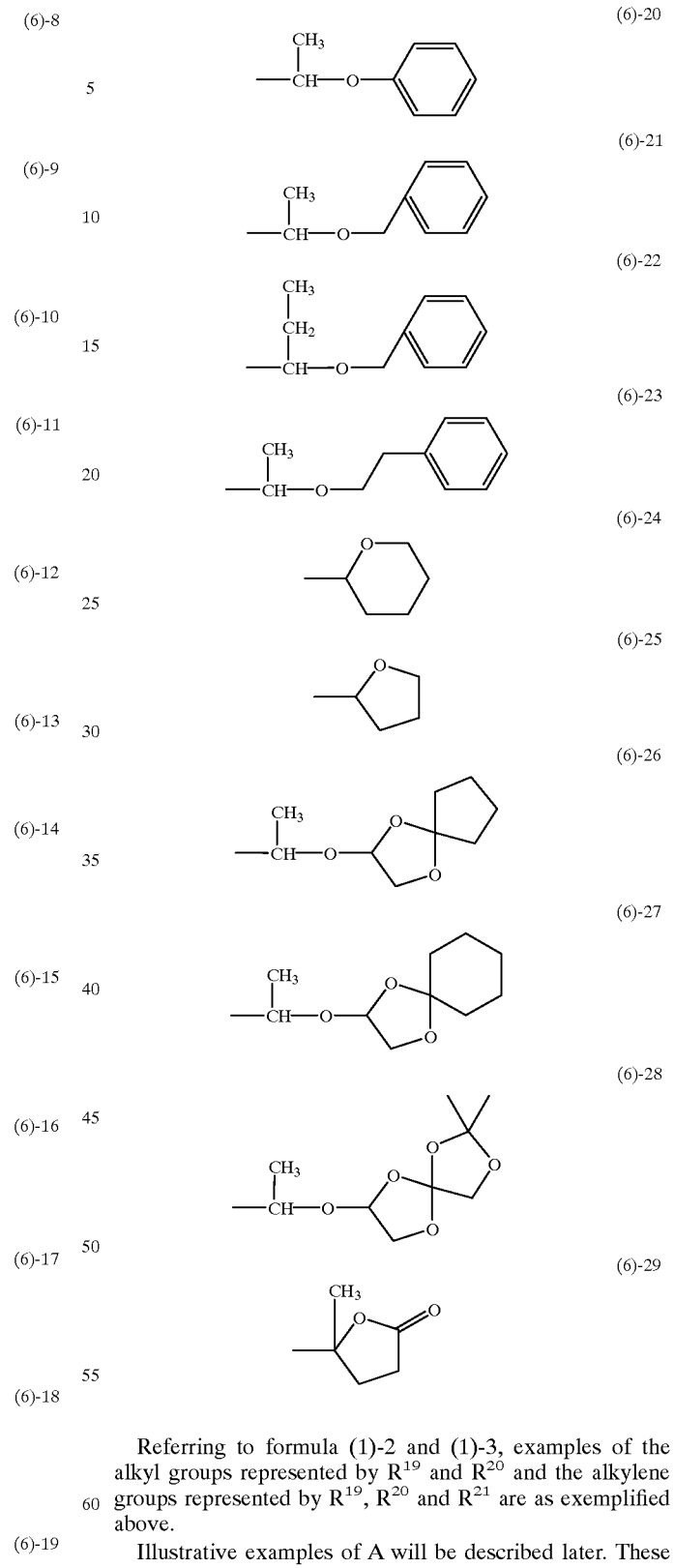

Referring to formula (1)-2 and (1)-3, examples of the alkyl groups represented by $R^{19}$ and $R^{20}$ and the alkylene groups represented by $R^{19}$, $R^{20}$ and $R^{21}$ are as exemplified above.

Illustrative examples of A will be described later. These crosslinking groups (1)-2 and (1)-3 originate from alkenyl ether compounds and halogenated alkyl ether compounds.

As understood from the value of "a" in formula (1)-2 or (1)-3, the crosslinking group is not limited to a divalent one and trivalent to octavalent groups are acceptable. For example, the divalent and trivalent crosslinking groups are exemplified by groups of the following formulas.

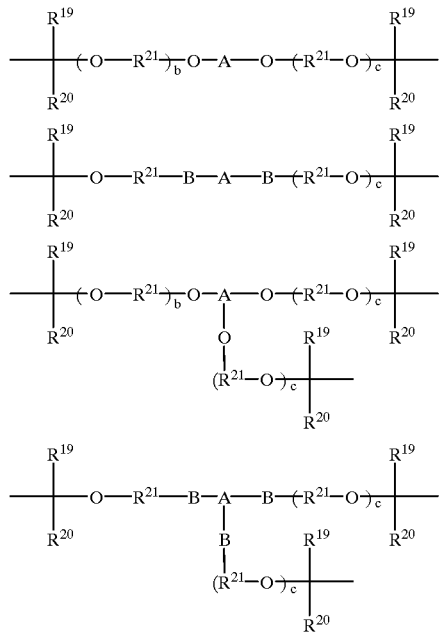

Now A in the crosslinking group is described. The (a+1)-valent organic groups represented by A include hydrocarbon groups, for example, substituted or unsubstituted alkylene groups preferably having 1 to 50 carbon atoms, and especially 1 to 40 carbon atoms, substituted or unsubstituted arylene groups preferably having 6 to 50 carbon atoms, and especially 6 to 40 carbon atoms (these alkylene and arylene groups may have an intervening hetero atom or group such as O, NH, N(CH$_3$), S or SO$_2$, and where substituted, the substituents are hydroxyl, carboxyl, acyl and fluorine), and combinations of these alkylene groups with these arylene groups, as well as tri to octa-valent groups of the foregoing groups from which hydrogen atoms attached to carbon atoms are eliminated. Additional examples include (a+1)-valent heterocyclic groups, and combinations of these heterocyclic groups with the foregoing hydrocarbon groups.

Illustrative examples of A are given below.

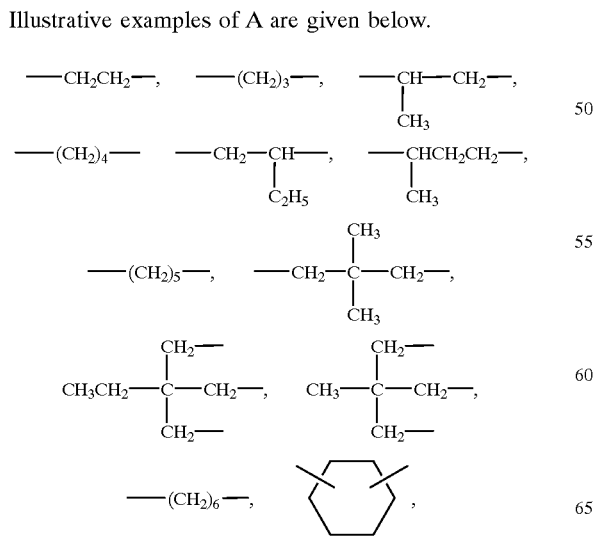

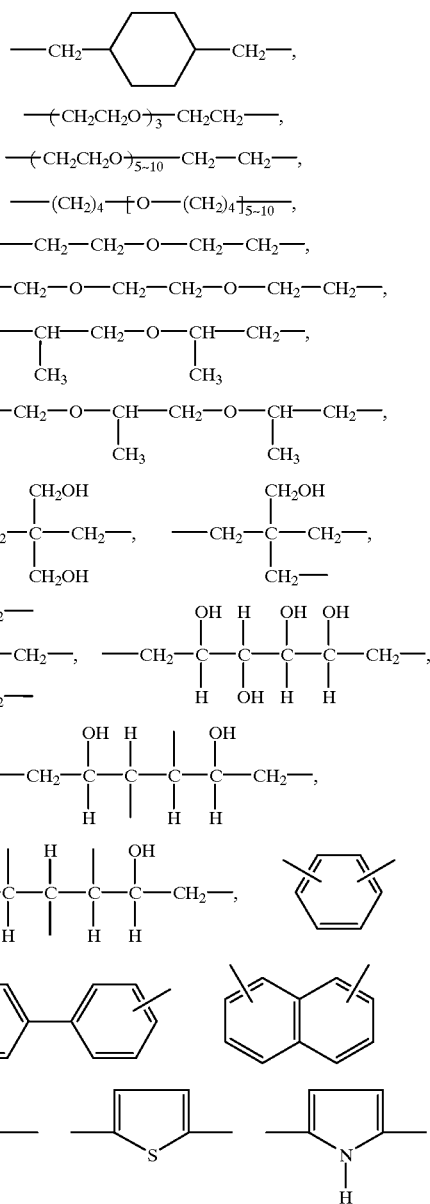

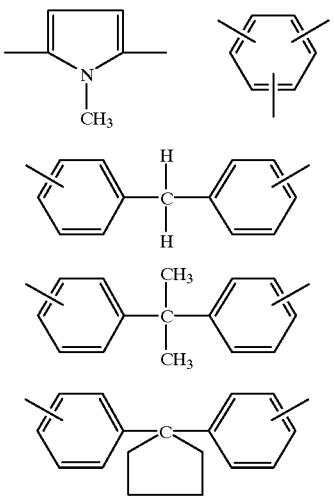

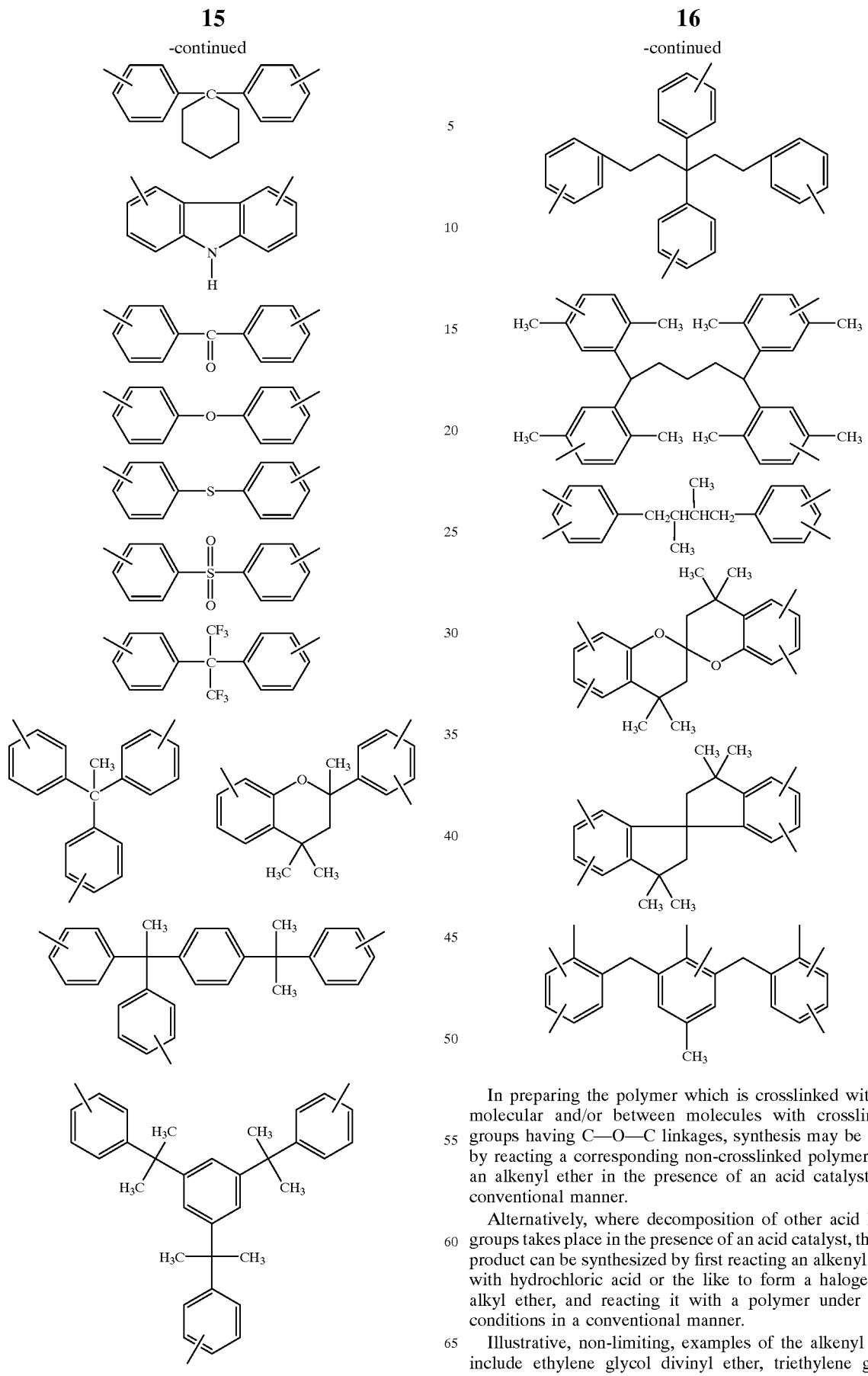

In preparing the polymer which is crosslinked within a molecular and/or between molecules with crosslinking groups having C—O—C linkages, synthesis may be made by reacting a corresponding non-crosslinked polymer with an alkenyl ether in the presence of an acid catalyst in a conventional manner.

Alternatively, where decomposition of other acid labile groups takes place in the presence of an acid catalyst, the end product can be synthesized by first reacting an alkenyl ether with hydrochloric acid or the like to form a halogenated alkyl ether, and reacting it with a polymer under basic conditions in a conventional manner.

Illustrative, non-limiting, examples of the alkenyl ether include ethylene glycol divinyl ether, triethylene glycol divinyl ether, 1,2-propanediol divinyl ether, 1,3-propanediol divinyl ether, 1,3-butanediol divinyl ether, 1,4-butanediol divinyl ether, neopentyl glycol divinyl ether, trimethylolpropane trivinyl ether, trimethylolethane trivinyl ether, hexanediol divinyl ether, 1,4-cyclohexane-diol divinyl ether, 1,4-divinyloxymethylcyclohexane, tetraethylene glycol divinyl ether, pentaerythritol divinyl ether, pentaerythritol trivinyl ether, pentaerythritol tetravinyl ether, sorbitol tetravinyl ether, sorbitol pentavinyl ether, ethylene glycol diethylene vinyl ether, triethylene glycol diethylene vinyl ether, ethylene glycol dipropylene vinyl ether, triethylene glycol diethylene vinyl ether, trimethylolpropane triethylene vinyl ether, trimethylolpropane diethylene vinyl ether, pentaerythritol diethylene vinyl ether, pantaerythritol triethylene vinyl ether, pentaerythritol tetraethylene vinyl ether, and the compounds of the following formulae (I-1) through (I-31).

(I-1)

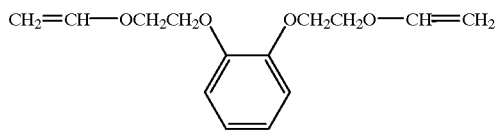
(I-2)

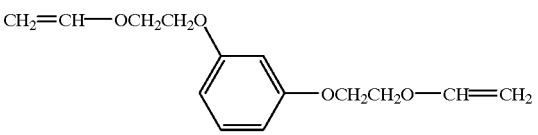
(I-3)

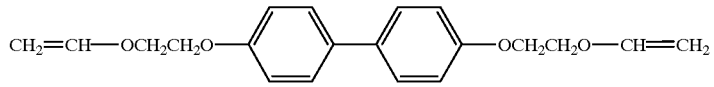
(I-4)

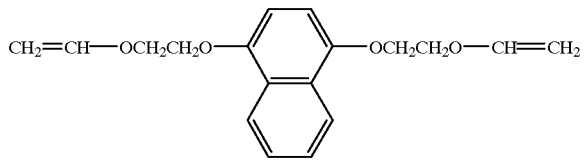
(I-5)

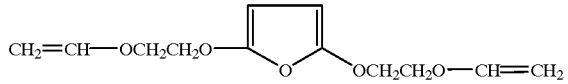
(I-6)

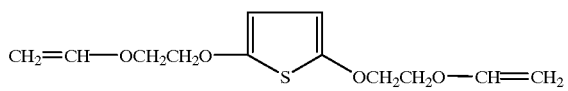
(I-7)

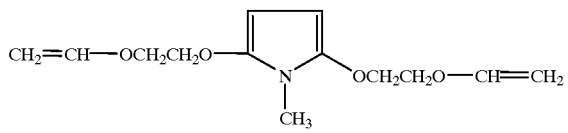
(I-8)

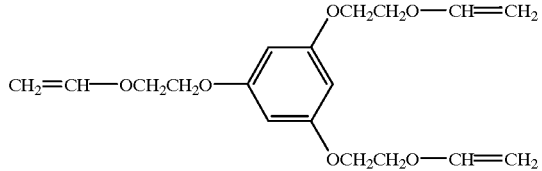
(I-9)

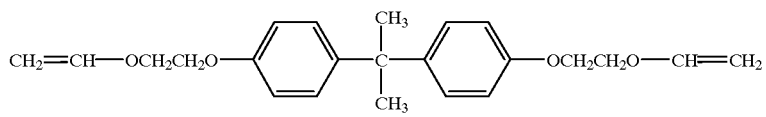
(I-10)

-continued
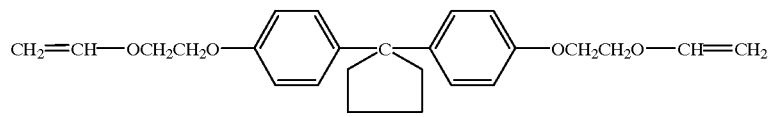
(I-11)
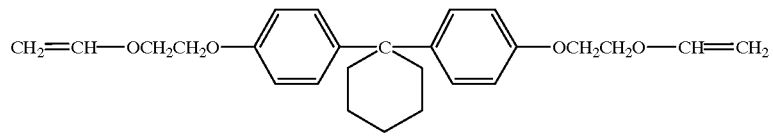
(I-12)
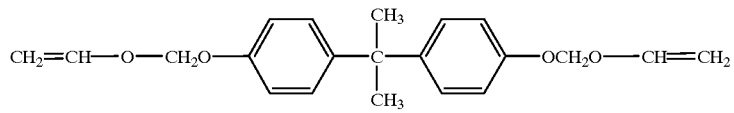
(I-13)
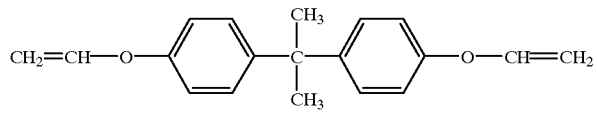
(I-14)
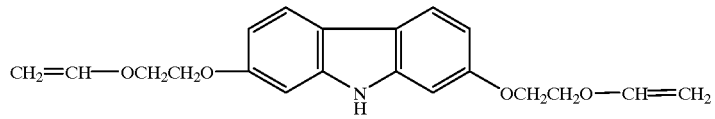
(I-15)
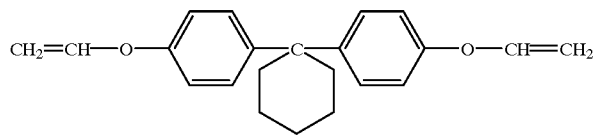
(I-16)
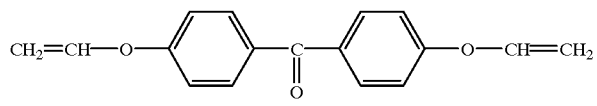
(I-17)
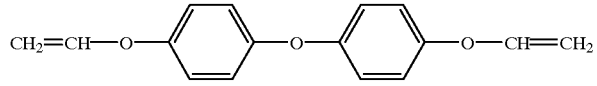
(I-18)
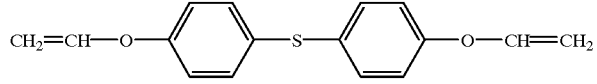
(I-19)
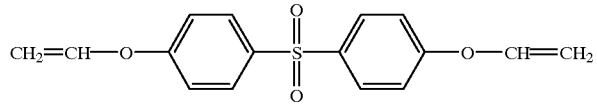
(I-20)
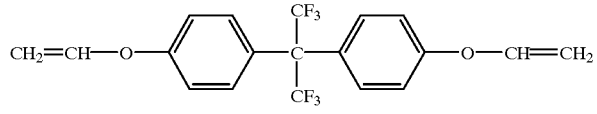
(I-21)

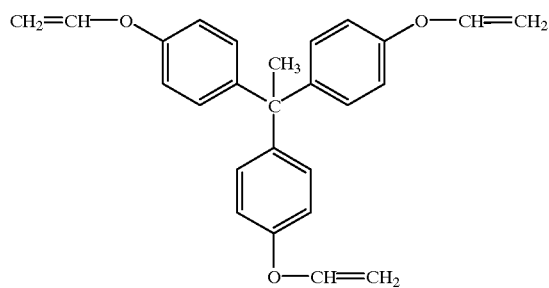
(I-22)
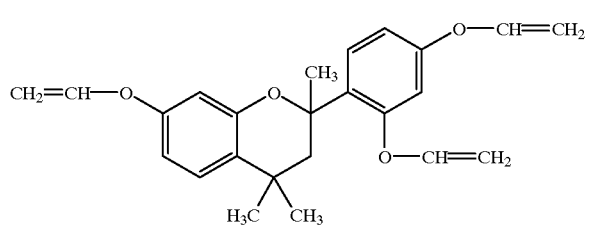
(I-23)
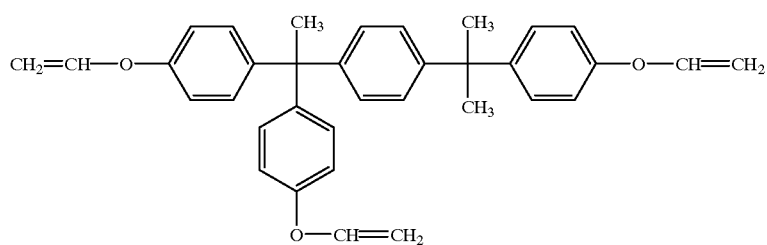
(I-24)
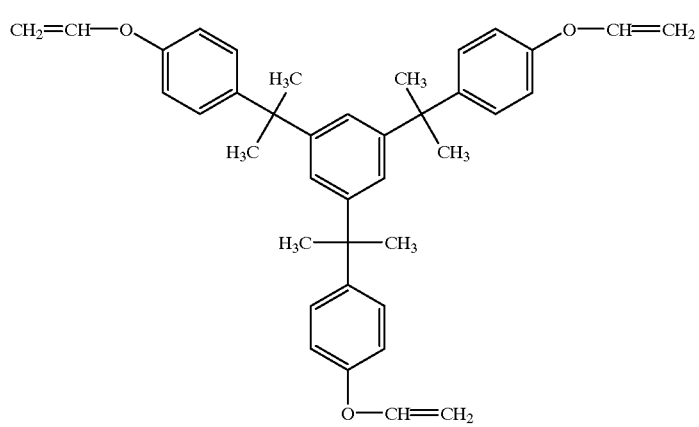
(I-25)
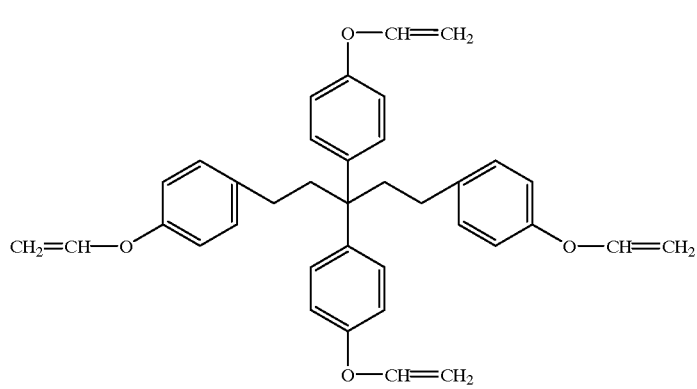
(I-26)

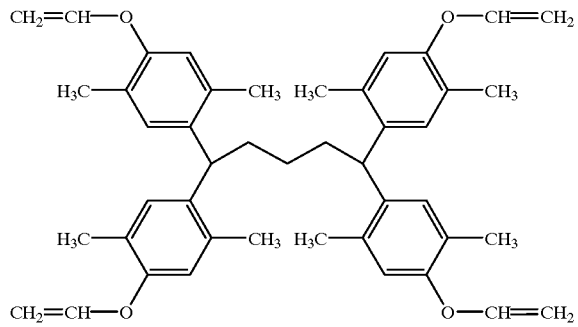

(I-27)

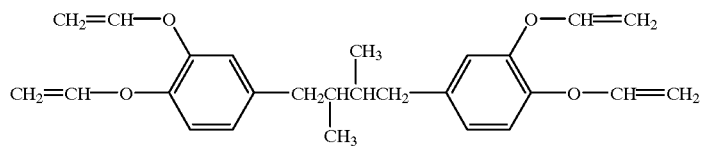

(I-28)

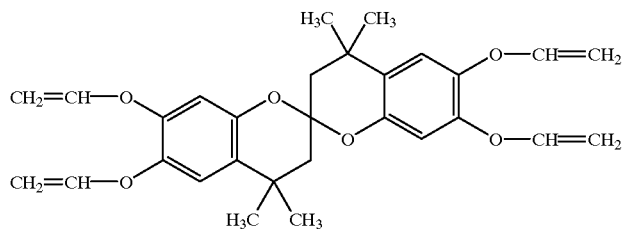

(I-29)

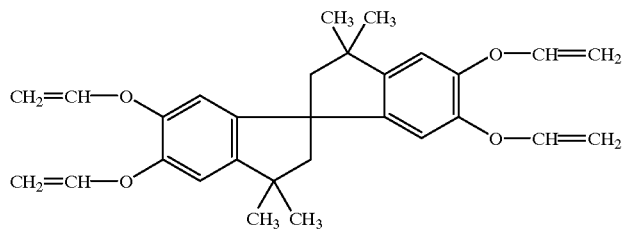

(I-30)

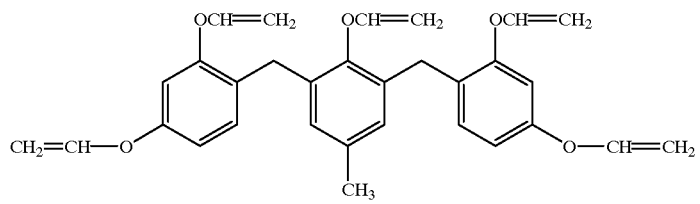

(I-31)

Also useful are terephthalic acid diethylene vinyl ether, phthalic acid diethylene vinyl ether, isophthalic acid diethylene vinyl ether, phthalic acid dipropylene vinyl ether, terephthalic acid dipropylene vinyl ether, isophthalic acid dipropylene vinyl ether, maleic acid diethylene vinyl ether, fumaric acid diethylene vinyl ether, and itaconic acid diethylene vinyl ether as well as the compounds of the following formulae (II-1) through (II-11). Useful alkenyl ethers are not limited to these examples.
The crosslinking acetal groups of formulae (1)-2 and (1)-3 are exemplified by the following formulae (7)-1 through (7)-8.
(II-1)
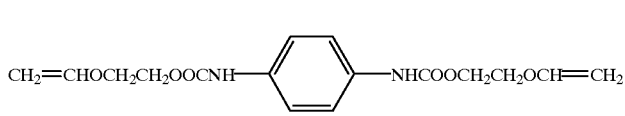
(II-2)
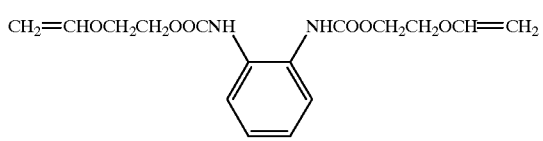
(II-3)
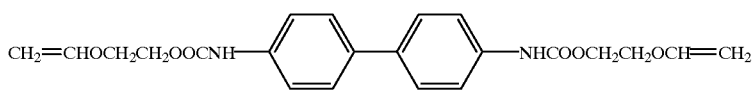
(II-4)
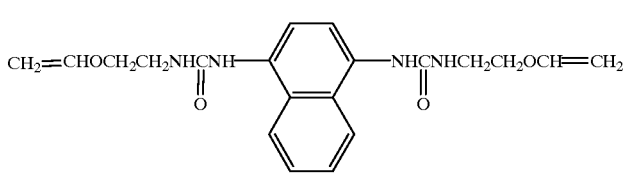
(II-5)
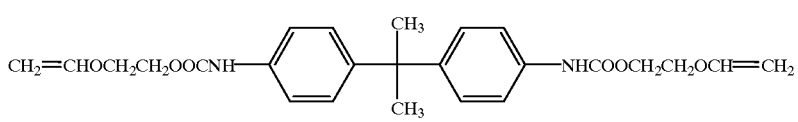
(II-6)
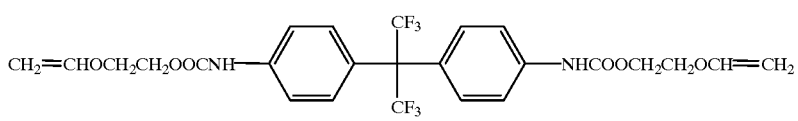
(II-7)
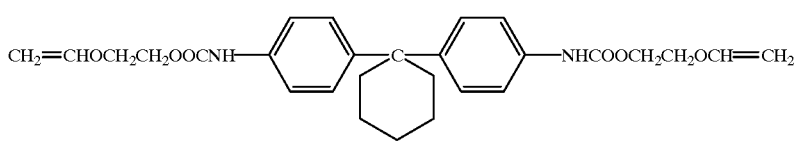
(II-8)
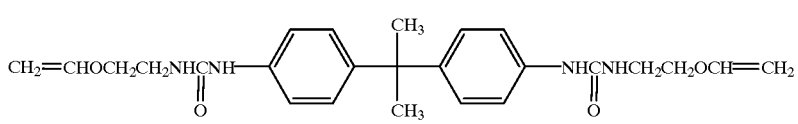
(II-9)
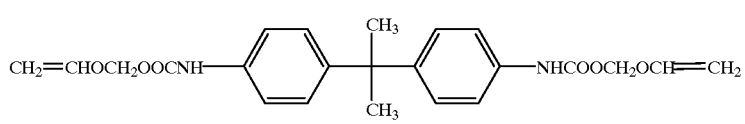
(II-10)
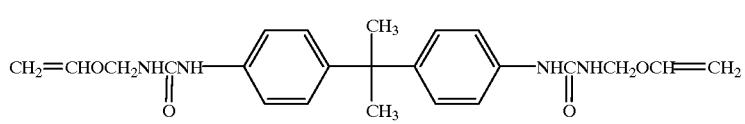
(II-11)
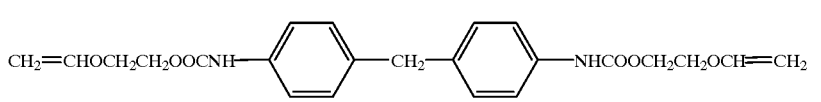

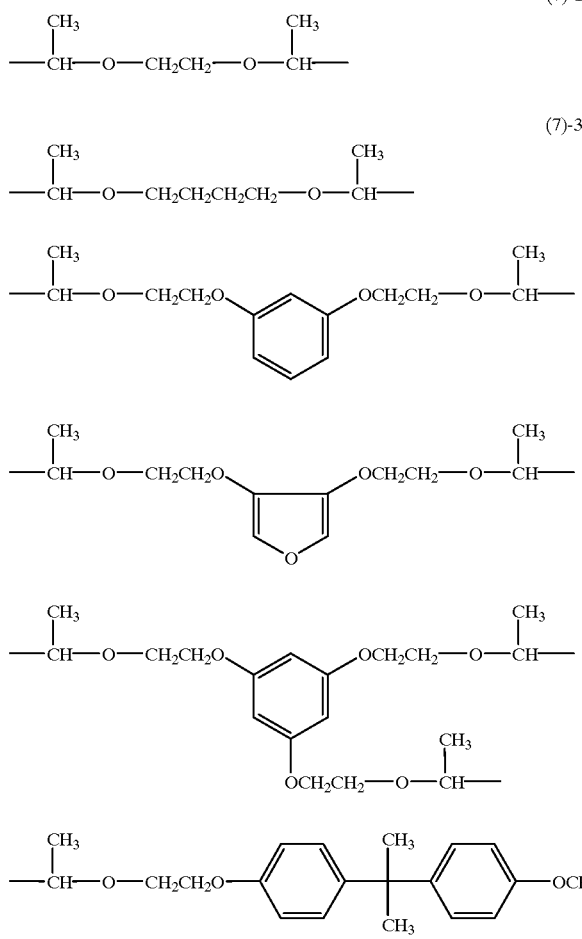

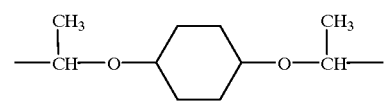

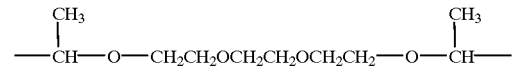

Next, the second acid labile groups have the following formulae (2)-1, (3)-1, (2)-2 and (3)-2.

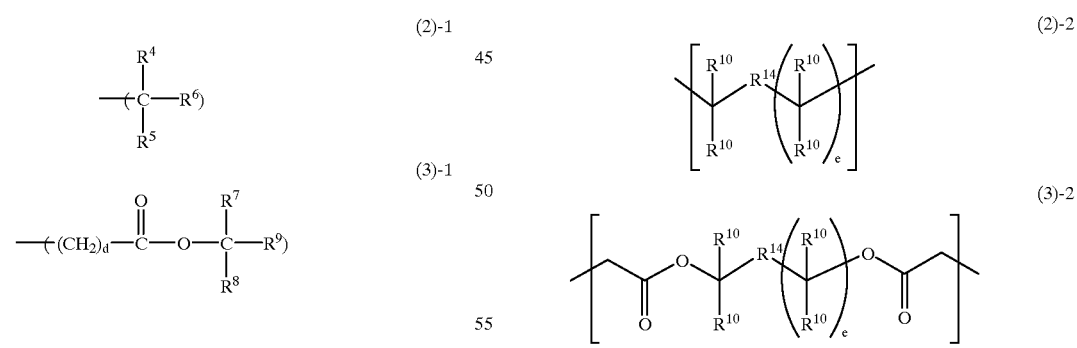

Herein $R^4$ to $R^9$ each are a straight, branched or cyclic alkyl group of 1 to 20 carbon atoms or aryl group of 6 to 20 carbon atoms, at least one of $R^4$, $R^5$ and $R^6$ and at least one of $R^7$, $R^8$ and $R^9$ are cyclic alkyl groups of 5 to 20 carbon atoms or aryl groups of 6 to 20 carbon atoms, which may contain a hetero atom such as oxygen, sulfur, nitrogen or fluorine. Alternatively, $R^4$, $R^5$ and $R^6$, and $R^7$, $R^8$ and $R^9$, taken together, may form a ring of 5 to 30 carbon atoms, which may contain a hetero atom such as oxygen, sulfur, nitrogen or fluorine. The total number of carbon atoms in $R^4$, $R^5$ and $R^6$ and the total number of carbon atoms in $R^7$, $R^8$ and $R^9$ each are in the range of 6 to 30. The letter "d" is an integer of 0 to 4.

Herein $R^{10}$ and $R^{14}$ each are a straight, branched or cyclic alkyl group of 1 to 20 carbon atoms or aryl group of 6 to 20 carbon atoms, either one of $R^{10}$ and $R^{14}$ is a cyclic alkyl group of 5 to 20 carbon atoms or aryl group of 6 to 20 carbon atoms, which may contain a hetero atom such as oxygen, sulfur, nitrogen or fluorine. Letter "e" is an integer of 1 to 3.

Referring to formulae (2)-1 and (3)-1, examples of the alkyl and aryl groups represented by $R^4$ to $R^9$ are as exemplified above.

Examples of the acid labile groups substituted with tertiary hydrocarbon groups or tertiary hydrocarbon group-containing substituents of the formula (2)-1 or (3)-1 include groups of the following formulae (4)-1 through (4)-27.
(4)-1
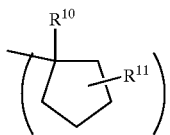
(4)-2
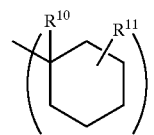
(4)-3
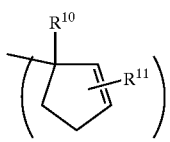
(4)-4
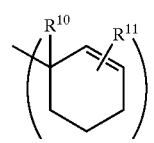
(4)-5
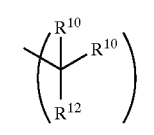
(4)-6
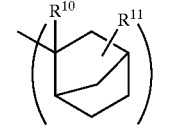
(4)-7
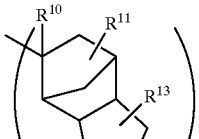
(4)-8
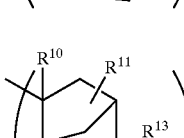
(4)-9
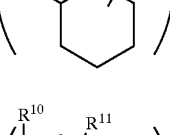
(4)-10
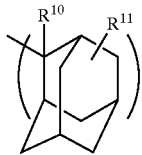
(4)-11
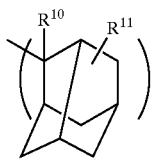
(4)-12
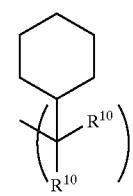
(4)-13
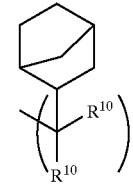
(4)-14
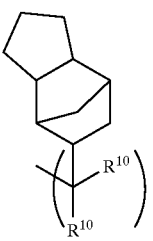
(4)-15
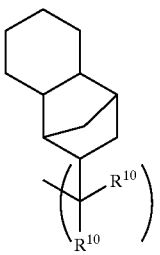
(4)-16
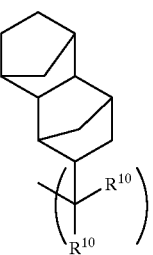

(4)-17
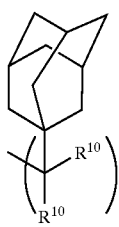

(4)-18
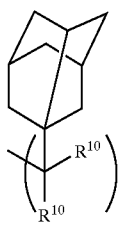

(4)-19
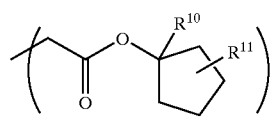

(4)-20
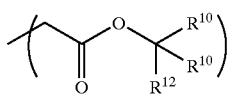

(4)-21
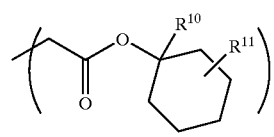

(4)-22
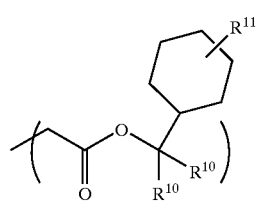

(4)-23
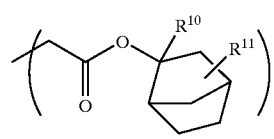

(4)-24
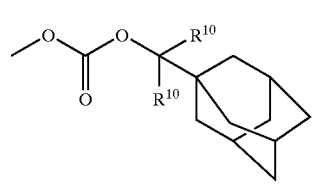

(4)-25
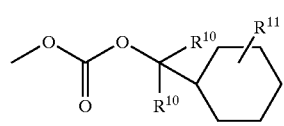

(4)-26
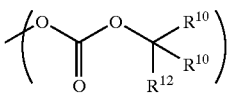

(4)-27
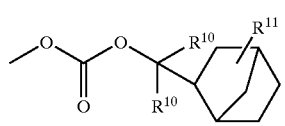

$R^{10}$ which may be the same or different is a straight, branched or cyclic alkyl group of 1 to 8 carbon atoms or aryl group of 6 to 20 carbon atoms. $R^{11}$ and $R^{13}$ each are hydrogen or a straight, branched or cyclic alkyl group of 1 to 20 carbon atoms. $R^{12}$ is an aryl group of 6 to 20 carbon atoms.

Examples of the alkyl groups represented by $R^{10}$, $R^{11}$ and $R^{13}$ are as exemplified above.

$R^{10}$, $R^{11}$ and $R^{13}$ may contain a hetero atom such as oxygen, nitrogen or sulfur. Examples include groups of the following formulae (5)-1 through (5)-7.

(5)-1

(5)-2
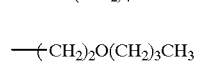

(5)-3
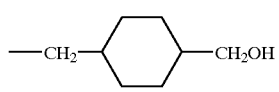

(5)-4

(5)-5

(5)-6
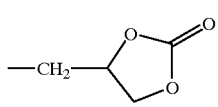

(5)-7
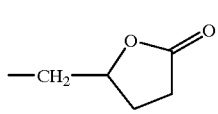

In formulae (2)-2 and (3)-2, $R^{10}$ is as defined above, and the alkylene and arylene groups represented by $R^{14}$ correspond to the above-exemplified alkyl and aryl groups with one hydrogen atom being eliminated.

Examples of the acid labile groups of formulae (2)-2 and (3)-2 are given below.

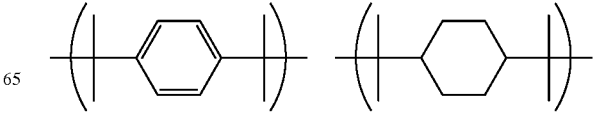

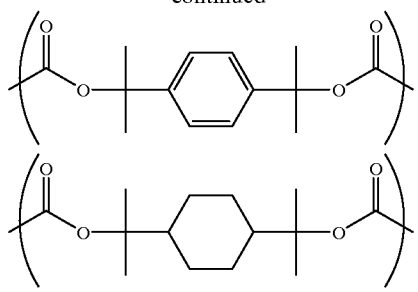

The alkali insoluble or substantially alkali insoluble resins having the aforementioned acid labile groups include those comprising recurring units of the following formula (8).

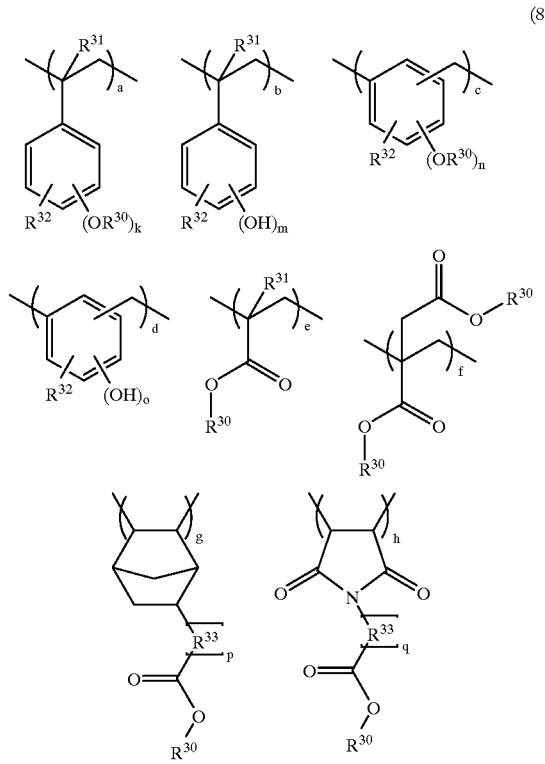

(8)

Herein $R^{30}$ is an acid labile group as described above, and $R^{31}$, $R^{32}$ and $R^{33}$ are as defined above. The alkyl groups represented by $R^{31}$ and $R^{32}$ are as exemplified above, and the fluorinated alkyl groups correspond to these alkyl groups in which some or all of the hydrogen atoms are substituted with fluorine atoms. The alkylene groups represented by $R^{33}$ are also as exemplified above.

The letters k and n each are an integer of 1 to 5, m is 0 or an integer of 1 to 4, "o" is 0 or an integer of 1 to 3, and p and q are equal to 0 or 1. The letters a, b, c, d, e, f, g and h are in the range of: $0 \leq a/(a+b+c+d+e+f+g+h) \leq 1$, $0 \leq b/(a+b+c+d+e+f+g+h) < 1$, $0 \leq c/(a+b+c+d+e+f+g+h) < 1$, $0 \leq d/(a+b+c+d+e+f+g+h) < 1$, $0 \leq e/(a+b+c+d+e+f+g+h) < 1$, $0 \leq f/(a+b+c+d+e+f+g+h) < 1$, $0 \leq g/(a+b+c+d+e+f+g+h) < 1$, and $0 \leq h/(a+b+c+d+e+f+g+h) \leq 1$. The letters also satisfy: $0 < (a+c+e+f+g+h)/(a+b+c+d+e+f+g+h) < 1$, preferably $0.1 < (a+c+e+f+g+h)/(a+b+c+d+e+f+g+h) < 0.9$, and more preferably $0.2 < (a+c+e+f+g+h)/(a+b+c+d+e+f+g+h) < 0.8$.

It is noted that if necessary, the resin is partially substituted with acid labile groups other than the above-described ones, for example, tert-butoxy and tert-butoxycarbonyl groups. A blend of polymers substituted with such substituents is also acceptable.

In addition to the recurring units of formula (8), the base resin may have copolymerized therein an acrylic acid derivative, methacrylic acid derivative, norbornene derivative, maleic anhydride, maleimide, acrylonitrile, vinyl acetate, vinyl alcohol, tetrafluoroethylene or the like. Preferably the base resin has a weight average molecular weight in the range of about 2,000 to about 100,000.

In general, the above resin is prepared by well-known methods, for example, a method of polymerizing a suitable monomer or monomers to form an alkali soluble polymer having carboxyl and/or phenolic hydroxyl groups, and then introducing acid labile groups into the carboxyl and/or phenolic hydroxyl groups, or a method of polymerizing a suitable monomer or monomers having acid labile groups. The polymerization reaction depends on the type of initiator or catalyst, trigger means (including light, heat, radiation and plasma), and polymerization conditions (including temperature, pressure, concentration, solvent, and additives). Commonly used for polymerization to form the polymer of the invention are radical copolymerization of triggering polymerization with radicals of $\alpha,\alpha'$-azobisisobutyronitrile (AIBN) or the like, and ion (anion) polymerization using catalysts such as alkyl lithium. Such polymerization may be effected in a conventional manner.

The alkali insoluble or substantially alkali insoluble resins may be dendritic polymers or hyperbranched polymers comprising recurring units of the following formula (9) or (10)-1 through (10)-5.

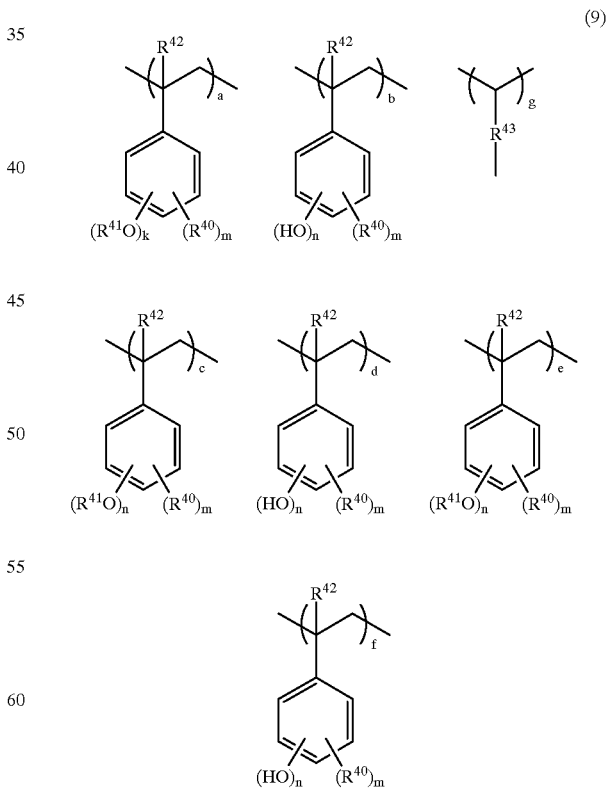

(9)

Herein, $R^{40}$ which may be the same or different is hydrogen, a straight, branched or cyclic alkyl group of 1 to 20 carbon atoms or aryl group of 6 to 20 carbon atoms; $R^{41}$ is an acid labile group as defined above; $R^{42}$ is hydrogen or a straight, branched or cyclic alkyl group of 1 to 6 carbon atoms; $R^{43}$ is a straight, branched or cyclic alkylene group of 1 to 20 carbon atoms or arylene group of 6 to 20 carbon atoms, which may contain an ether bond or ester bond; letters k, m and g are in the range: $0 \leq k \leq 5$, $0 \leq m \leq 5$, k+m=5, and $1 \leq g \leq 1,000$, preferably $1 \leq g \leq 100$, more preferably $1 \leq g \leq 50$.

The alkyl and aryl groups represented by $R^{40}$, the alkyl groups represented by $R^{42}$, and the alkylene and arylene groups represented by $R^{43}$ are as exemplified above.

The letters "a" to "f" are 0 or positive numbers, a and b, c and d, and e and f in each pair are not equal to 0 at the same time. The values of a/(a+b), c/(c+d), e/(e+f), (a+c+e)/(a+b+c+d+e+f) each are in the range of 0 to 1, preferably up to 0.8, more preferably up to 0.6 and even more preferably up to 0.5. The preferred lower limit is a positive number above 0, more preferably at least 0.01, even more preferably at least 0.05, and especially at least 0.1. These values may be the same or different.

The dendritic or hyperbranched polymers usually have a weight average molecular weight of about 500 to 10,000,000, preferably about 1,000 to about 1,000,000, more preferably about 1,000 to 100,000, and even more preferably about 2,000 to 50,000. The molecular weight distribution Mw/Mn is not critical although a Mw/Mn of 1.0 to 5.0, especially 1.0 to 3.0 is preferred.

Illustrative examples of the dendritic or hyperbranched polymers include polymers comprising recurring units of the following approximate formulae (10)-1 through (10)-5.

(10)-1

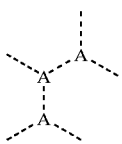
(10)-2

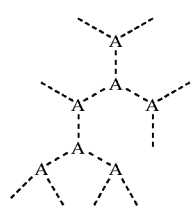
(10)-3

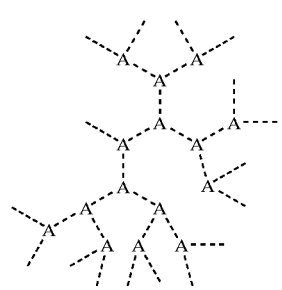
(10)-4

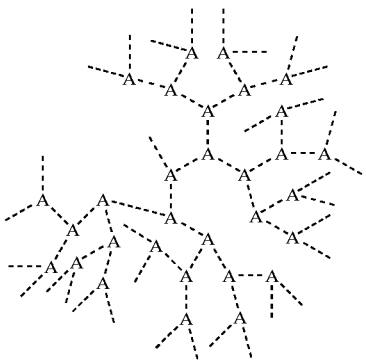
(10)-5

In the formulae, broken lines represent polymer chains of the recurring units (11) shown below, and A represents the units (12) shown below. The number of broken line segments between A and A is depicted merely for the sake of convenience, independent of the number of concatenated (or recurred) units (11) included between A and A.

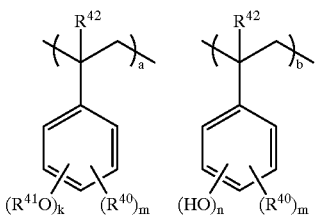
(11)

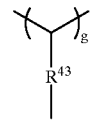
(12)

According to the invention, the dendritic or hyperbranched polymer is prepared by effecting living polymerization of a phenol derivative, reacting with a compound having a polymerizable moiety and a compound having a terminating moiety and proceeding further polymerization. By repeating this operation any desired times, a dendritic or hyperbranched polymer of a phenol derivative can be synthesized. The living polymerization may be effected by any desired technique although living anion polymerization is preferred because of ease of control.

For example, living anion polymerization is initiated using a first monomer of the general formula (i) and/or a second monomer of the general formula (ii). After a predetermined amount of the monomer or monomers is polymerized to form an intermediate, a branching monomer of the general formula (iii) is added and reacted with the intermediate. Then the first monomer of formula (i) and/or the second monomer of formula (ii) are added again and polymerized. This operation is repeated until a desired polymer is obtained.

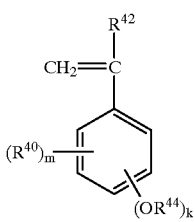
(i)

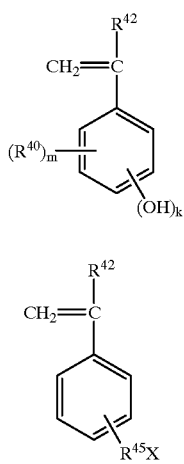

Herein $R^{40}$, $R^{42}$, k, and m are as defined above. $R^{44}$ is a protective group for a hydroxyl group, for example, a straight, branched or cyclic, primary, secondary or tertiary alkyl group of 1 to 6 carbon atoms or trialkylsilyl group. $R^{45}$ is a valence bond or an alkylene group of 1 to 20 carbon atoms, preferably 1 to 10 carbon atoms. X is a halogen atom, aldehyde group or alkoxycarbonyl group. The protective group represented by $R^{44}$ is not critical and may be selected from well-known ones. The protective group can be finally eliminated by a conventional technique.

For living anion polymerization to take place, the reaction solvent is preferably selected from toluene, benzene, tetrahydrofuran, dioxane, and ethyl ether. Of these, polar solvents such as tetrahydrofuran, dioxane, and ethyl ether are preferable. They may be used alone or in admixture of two or more.

The initiator used herein is preferably selected from sec-butyl lithium, n-butyl lithium, naphthalene sodium and cumyl potassium. The amount of the initiator used is proportional to the design molecular weight.

Preferred reaction conditions include a temperature of about –80° C. to 100° C., preferably about –70° C. to 0° C., and a time of about 0.1 to 50 hours, preferably about 0.5 to 5 hours.

One exemplary reaction scheme using sec-butyl lithium as the initiator is shown below. The degree of branching can be altered by repeating the reaction desired times.

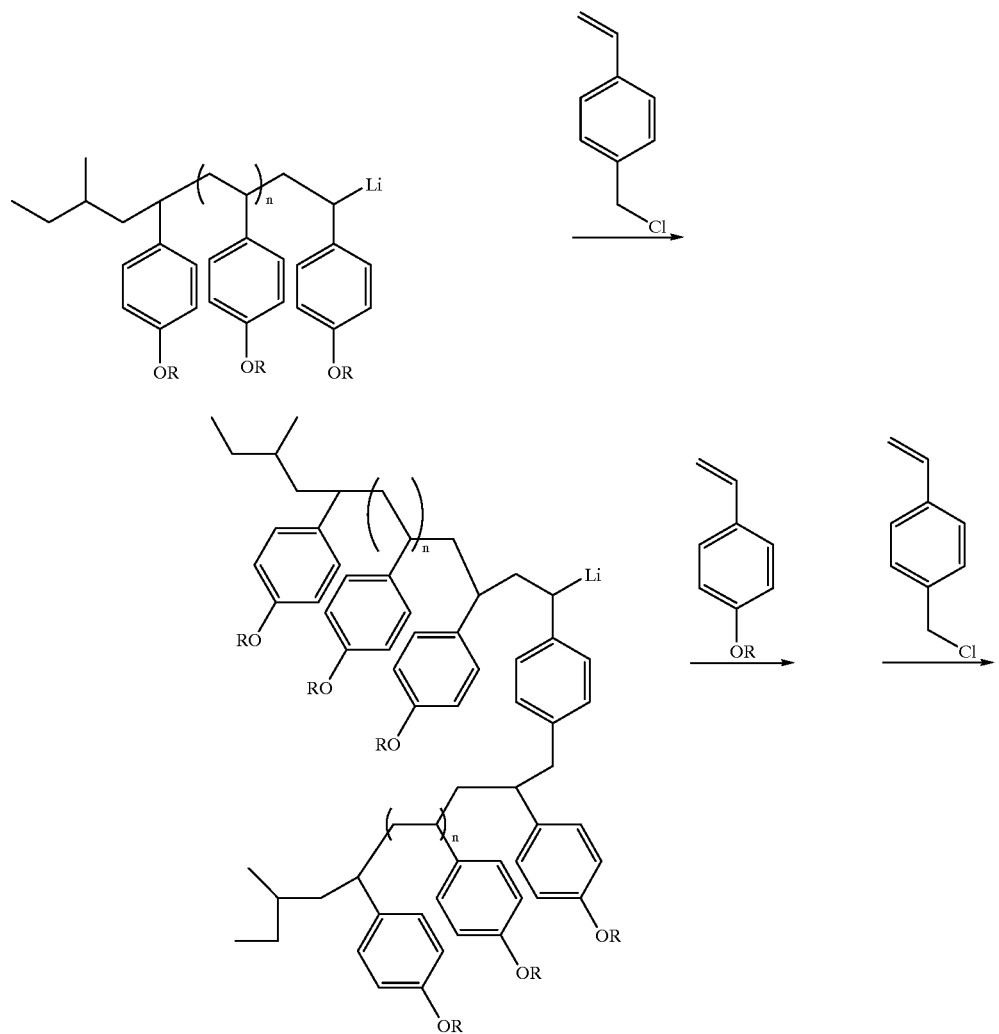

-continued

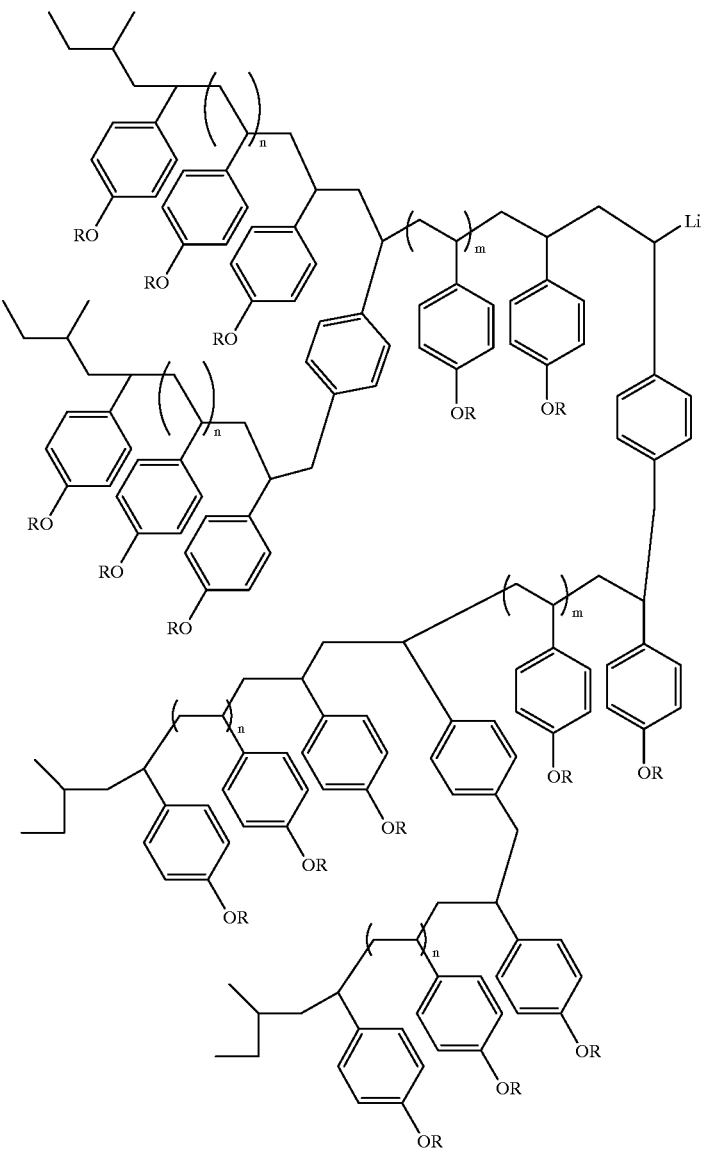

When acid labile groups are to be introduced, the desired acid labile groups or acid stable groups may be introduced to the phenolic hydroxyl groups on the resulting poly(p-hydroxystyrene) by a well-known technique. Alternatively, polymerization may be effected as above using a hydroxystyrene derivative monomer having acid labile groups introduced to its phenolic hydroxyl groups.

The acid labile groups represented by $R^{30}$ and $R^{41}$ are one or more of the groups of formulae (1)-1, (1)-2, (1)-3, (2)-1, (2)-2, (3)-1 and (3)-2.

As described above, the alkali insoluble or substantially alkali insoluble resin used as a base in the resist composition of the invention may be a mixture of a carboxyl or phenolic hydroxyl group-containing base resin soluble in aqueous alkaline solution, having first acid labile groups incorporated therein by substituting acetal or ketal groups of the formula (1)-1, (1)-2 or (1)-3 for at least some of the hydrogen atoms on the carboxyl or phenolic hydroxyl groups so that the resin becomes insoluble or substantially insoluble in alkali, and another carboxyl or phenolic hydroxyl group-containing base resin soluble in an aqueous alkaline solution, having second acid labile groups incorporated therein by substituting tertiary hydrocarbon groups or tertiary hydrocarbon group-containing substituents of the formula (2)-1, (2)-2, (3)-1 or (3)-2 for at least some of the hydrogen atoms on the carboxyl or phenolic hydroxyl groups so that the resin becomes insoluble or substantially insoluble in alkali; or a carboxyl or phenolic hydroxyl group-containing base resin soluble in aqueous alkaline solution, having acid labile groups of at least two types incorporated therein so that the resin becomes insoluble or substantially insoluble in alkali, wherein the acid labile groups of at least two types include first acid labile groups obtained by substituting acetal or ketal groups of the formula (1)-1, (1)-2 or (1)-3 for some of the hydrogen atoms on the carboxyl or phenolic hydroxyl groups and second acid labile groups obtained by substituting tertiary hydrocarbon groups or tertiary hydrocarbon group-containing substituents of the formula (2)-1, (2)-2, (3)-1 or (3)-2 for at least some of the remaining hydrogen atoms. In the overall base resin(s), the molar ratio of first to second acid labile groups is preferably from 5:95 to 95:5, more preferably from 10:90 to 90:10, and even more preferably from 12:88 to 88:12.

Resist Composition

The invention provides chemical amplification type positive resist compositions which use the above-described polymers as the base resin.

The chemically amplified positive resist composition is defined as comprising (A) the above-described base resin, (B) an organic solvent, and (C) a photoacid generator. The positive resist composition may further include (D) a basic compound and (E) a dissolution inhibitor.

Organic Solvent (B)

The organic solvent (B) used herein may be any organic solvent in which the base resin, photoacid generator, and other components are soluble. Illustrative, non-limiting, examples of the organic solvent include ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate. These solvents may be used alone or in combinations of two or more thereof.

An appropriate amount of the solvent blended is about 100 to 20,000 parts, especially about 300 to 5,000 parts by weight per 100 parts by weight of the base resin.

Photoacid Generator (C)

Suitable examples of the photoacid generator (C) include onium salts of the general formula (16) below, diazomethane derivatives of the general formula (17) below, glyoxime derivatives of the general formula (18) below, β-ketosulfone derivatives, disulfone derivatives, nitrobenzylsulfonate derivatives, sulfonic acid ester derivatives, and imido-yl sulfonate derivatives. Photoacid generators capable of generating camphorsulfonic acid are especially preferred.

$$(R^+)_b M^+ K^- \tag{16}$$

In the formula, $R^{30}$ is a straight, branched or cyclic alkyl of 1 to 12 carbon atoms, an aryl of 6 to 12 carbon atoms, or an aralkyl of 7 to 12 carbon atoms; $M^+$ is iodonium or sulfonium; $K^-$ is a non-nucleophilic counter-ion; and the letter b is 2 or 3.

Illustrative examples of alkyl groups represented by $R^{30}$ include methyl, ethyl, propyl, butyl, cyclohexyl, 2-oxocyclohexyl, norbornyl, and adamantyl. Exemplary aryl groups include phenyl; alkoxyphenyl groups such as p-methoxyphenyl, m-methoxyphenyl, o-methoxyphenyl, ethoxy-phenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary aralkyl groups include benzyl and phenethyl. Examples of the non-nucleophilic counter-ion represented by $K^-$ include halide ions such as chloride and bromide; cyclic alkyl sulfonates such as camphorsulfonate, norbornenesulfonate and adamantanesulfonate; fluoroalkylsulfonate ions such as triflate, 1,1,1-trifluoroethanesulfonate, and nonafluoro-butanesulfonate; arylsulfonate ions such as tosylate, benzenesulfonate, 4-fluorobenzenesulfonate, 1,2,3,4,5-pentafluorobenzenesulfonate, 1-naphthylsulfonate, 2-naphthylsulfonate, p-methoxybenzenesulfonate, m-methoxybenzenesulfonate, p-fluorobenzenesulfonate, p-tert-butoxybenzenesulfonate, p-tosyloxybenzylsulfonate, p-phenyloxy-benzenesulfonate, p-benzyloxybenzenesulfonate and p-pivaloyloxybenzenesulfonate; and alkylsulfonate ions such as mesylate and butanesulfonate.

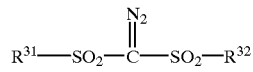

(17)

In the formula, $R^{31}$ and $R^{32}$ are straight, branched or cyclic alkyl or halogenated alkyl groups of 1 to 12 carbon atoms, aryl or halogenated aryl groups of 6 to 12 carbon atoms, or aralkyl groups of 7 to 12 carbon atoms.

Illustrative examples of alkyl groups represented by $R^{31}$ and $R^{32}$ include 10-camphor, methyl, ethyl, propyl, butyl, amyl, cyclopentyl, cyclohexyl, norbornyl, and adamantyl. Exemplary halogenated alkyl groups include trifluoromethyl, 1,1,1-trifluoroethyl, 1,1,1-trichloroethyl, and nonafluorobutyl. Exemplary aryl groups include phenyl; alkoxyphenyl groups such as p-methoxyphenyl, m-methoxy-phenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary halogenated aryl groups include fluorobenzene, chlorobenzene, and 1,2,3,4,5-pentafluorobenzene. Exemplary aralkyl groups include benzyl and phenethyl.

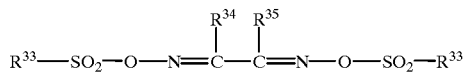

(18)

In the formula, $R^{33}$, $R^{34}$, and $R^{35}$ are straight, branched or cyclic alkyl or halogenated alkyl groups of 1 to 12 carbon atoms, aryl or halogenated aryl groups of 6 to 12 carbon atoms, or aralkyl groups of 7 to 12 carbon atoms. $R^{34}$ and $R^{35}$ may together form a cyclic structure with the proviso that if they form a cyclic structure, each is a straight or branched alkylene group of 1 to 6 carbon atoms.

The alkyl, halogenated alkyl, aryl, halogenated aryl, and aralkyl groups represented by $R^{33}$, $R^{34}$, and $R^{35}$ are exemplified by the same groups mentioned above for $R^{31}$ and $R^{32}$. Examples of alkylene groups represented by $R^{34}$ and $R^{35}$ include methylene, ethylene, propylene, butylene, and hexylene.

Illustrative examples of the photoacid generator include:
onium salts such as diphenyliodonium camphorsulfonate, (p-tert-butoxyphenyl)phenyliodonium camphorsulfonate, diphenyliodonium p-toluenesulfonate, (p-tert-butoxyphenyl)phenyliodonium p-toluenesulfonate, triphenylsulfonium camphorsulfonate, (p-tert-butoxyphenyl)-diphenylsulfonium camphorsulfonate, bis(p-tert-butoxyphenyl)phenylsulfonium camphorsulfonate, tris(p-tert-butoxyphenyl)sulfonium camphorsulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium p-toluenesulfonate, triphenylsulfonium nonafluorobutanesulfonate, triphenylsulfonium butanesulfonate, trimethylsulfonium camphorsulfonate, trimethylsulfonium p-toluenesulfonate, cyclohexylmethyl (2-oxocyclohexyl)sulfonium camphorsulfonate, cyclohexylmethyl-(2-oxocyclohexyl)sulfonium p-toluenesulfonate, dimethylphenylsulfonium camphorsulfonate, dimethylphenyl-sulfonium p-toluenesulfonate, dicyclohexylphenylsulfonium camphorsulfonate, and dicyclohexylphenylsulfonium p-toluenesulfonate;

diazomethane derivatives such as bis(camphorsulfonyl)-diazomethane, bis(benzenesulfonyl)diazomethane, bis(p-toluenesulfonyl)diazomethane, bis(xylenesulfonyl)-diazomethane, bis(cyclohexylsulfonyl)diazomethane, bis(cyclopentylsulfonyl)diazomethane, bis(n-butylsulfonyl)-diazomethane, bis(isobutylsulfonyl)diazomethane, bis(sec-butylsulfonyl)diazomethane, bis(n-propylsulfonyl)-diazomethane, bis(isopropylsulfonyl)diazomethane, bis(tert-butylsulfonyl)diazomethane, bis(n-amylsulfonyl)diazomethane, bis(isoamylsulfonyl)diazomethane, bis(sec-amylsulfonyl)diazomethane, bis(tert-amylsulfonyl)-diazomethane, 1-cyclohexylsulfonyl-1-(tert-butylsulfonyl)-diazomethane, 1-cyclohexylsulfonyl-1-(tert-amylsulfonyl)-diazomethane, and 1-tert-amylsulfonyl-1-(tert-butylsulfonyl)diazomethane;

glyoxime derivatives such as bis-o-(p-toluene-sulfonyl)-α-dimethylglyoxime, bis-o-(p-toluenesulfonyl)-α-diphenylglyoxime, bis-o-(p-toluenesulfonyl)-α-dicyclo-hexylglyoxime, bis-o-(p-toluenesulfonyl)-2,3-pentane-dioneglyoxime, bis-o-(p-toluenesulfonyl)-2-methyl-3,4-pentanedioneglyoxime, bis-o-(n-butanesulfonyl)-α-dimethyl-glyoxime, bis-o-(n-butanesulfonyl)-α-diphenylglyoxime, bis-o-(n-butanesulfonyl)-α-dicyclohexylglyoxime, bis-o-(n-butanesulfonyl)-2,3-pentanedioneglyoxime, bis-o-(n-butanesulfonyl)-2-methyl-3,4-pentanedioneglyoxime, bis-o-(methanesulfonyl)-α-dimethylglyoxime, bis-o-(trifluoro-methanesulfonyl)-α-dimethylglyoxime, bis-o-(1,1,1-trifluoroethanesulfonyl)-α-dimethylglyoxime, bis-o-(tert-butanesulfonyl)-α-dimethylglyoxime, bis-o-(perfluorooctane-α-sulfonyl)-α-dimethylglyoxime, bis-o-(cyclohexanesulfonyl)-α-dimethylglyoxime, bis-o-(benzenesulfonyl)-α-dimethylglyoxime, bis-o-(p-fluorobenzenesulfonyl)-α-dimethylglyoxime, bis-o-(p-tert-butylbenzenesulfonyl)-α-dimethylglyoxime, bis-o-(xylenesulfonyl)-α-dimethylglyoxime, and bis-o-(camphorsulfonyl)-α-dimethylglyoxime;

β-ketosulfone derivatives such as 2-cyclohexyl-carbonyl-2-(p-toluenesulfonyl)propane and 2-isopropyl-carbonyl-2-(p-toluenesulfonyl)propane;

disulfone derivatives such as diphenyl disulfone and dicyclohexyl disulfone;

nitrobenzyl sulfonate derivatives such as 2,6-dinitrobenzyl p-toluenesulfonate and 2,4-dinitrobenzyl p-toluenesulfonate;

sulfonic acid ester derivatives such as 1,2,3-tris(methanesulfonyloxy)benzene, 1,2,3-tris(trifluoromethanesulfonyloxy)benzene, and 1,2,3-tris(p-toluenesulfonyloxy)benzene; and imido-yl sulfonate derivatives such as phthalimidoyl triflate, phthalimidoyl tosylate, 5-norbornene-2,3-dicarboxyimidoyl triflate, 5-norbornene-2,3-dicarboxyimidoyl tosylate, and 5-norbornene-2,3-dicarboxyimidoyl n-butylsulfonate. These photoacid generators may be used singly or in combinations of two or more thereof.

The photoacid generator is added in an amount of about 0.2 to 20 parts by weight, and especially about 0.5 to 15 parts by weight, per 100 parts by weight of the base resin. At less than 0.2 part, the amount of acid generated during exposure may be too small and the sensitivity and resolution are poor, whereas the addition of more than 20 parts may result in poor etching resistance.

Basic Compound (D)

The basic compound (D) is preferably a compound capable of suppressing the rate of diffusion when the acid generated by the photoacid generator diffuses within the resist film. The inclusion of this type of basic compound holds down the rate of acid diffusion within the resist film, resulting in better resolution. In addition, it suppresses changes in sensitivity following exposure, thus reducing substrate and environment dependence, as well as improving the exposure latitude and the pattern profile. See JP-A 5-232706, 5-249683, 5-158239, 5-249662, 5-257282, 5-289322, and 5-289340.

Examples of basic compounds (D) include primary, secondary, and tertiary aliphatic amines, mixed amines, aromatic amines, heterocyclic amines, carboxyl group-bearing nitrogenous compounds, sulfonyl group-bearing nitrogenous compounds, hydroxyl group-bearing nitrogenous compounds, hydroxyphenyl group-bearing nitrogenous compounds, alcoholic nitrogenous compounds, amide derivatives, and imide derivatives. Of these, aliphatic amines are especially preferred.

Examples of suitable primary aliphatic amines include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, di-isopropylamine, di-n-butylamine, di-isobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyl-tetraethylenepentamine. Examples of suitable tertiary aliphatic amines include trimethylamine, triethylamine, tri-n-propylamine, tri-isopropylamine, tri-n-butylamine, tri-isobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethyl-methylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable carboxyl group-bearing nitrogenous compounds include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable sulfonyl group-bearing nitrogenous compounds include 3-pyridinesulfonic acid and pyridinium p-toluenesulfonate. Examples of suitable hydroxyl group-bearing nitrogenous compounds, hydroxyphenyl group-bearing nitrogenous compounds, and alcoholic nitrogenous compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-i-butanol, 4-(2-hydroxyethyl)morpholine, 2-(2-hydroxyethyl)-pyridine, 1-(2-hydroxyethyl)piperazine, 1-[2-(2-hydroxy-ethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

In addition, basic compounds of the following general formulas (19) and (20) may also be included.

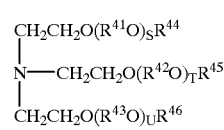
(19)

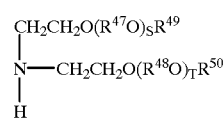
(20)

In the formulas, $R^{41}$, $R^{42}$ $R^{43}$ $R^{47}$ and $R^{48}$ are independently straight, branched or cyclic alkylenes of 1 to 20 carbon atoms; $R^{44}$, $R^{45}$, $R^{46}$, $R^{49}$ and $R^{50}$ are hydrogen, alkyls of 1 to 20 carbon atoms, or amino; $R^{44}$ and $R^{45}$, $R^{45}$ and $R^{46}$, $R^{44}$ and $R^{46}$, $R^{44}$ with $R^{45}$ and $R^{46}$, and $R^{49}$ and $R^{50}$ may bond together to form rings; and S, T and U are each integers from 0 to 20, with the proviso that hydrogen is excluded from $R^{44}$, $R^{45}$, $R^{46}$, $R^{49}$ and $R^{50}$ when S, T and U are equal to 0.

The alkylene groups represented by $R^{41}$, $R^{42}$, $R^{43}$, $R^{47}$ and $R^{48}$ preferably have 1 to 20 carbon atoms, more preferably 1 to 10 carbon atoms, and most preferably 1 to 8 carbon atoms. Examples include methylene, ethylene, n-propylene, isopropylene, n-butylene, isobutylene, n-pentylene, isopentylene, hexylene, nonylene, decylene, cyclopentylene, and cyclohexylene.

The alkyl groups represented by $R^{44}$, $R^{45}$, $R^{46}$, $R^{49}$ and $R^{50}$ preferably have 1 to 20 carbon atoms, more preferably 1 to 8 carbon atoms, and most preferably 1 to 6 carbon atoms, and may be straight, branched or cyclic. Examples include methyl, ethyl, n-propyl, isopropyl, n-butyl, isobutyl, tert-butyl, n-pentyl, isopentyl, hexyl, nonyl, decyl, dodecyl, tridecyl, cyclopentyl, and cyclohexyl.

Where a pair of $R^{44}$ and $R^{45}$, a pair of $R^{45}$ and $R^{46}$, a pair of $R^{44}$ and $R^{46}$, a combination of $R^{44}$ with $R^{45}$ and $R^{46}$, and a pair of $R^{49}$ and $R^{50}$ form rings, the rings preferably have 1 to 20 carbon atoms, more preferably 1 to 8 carbon atoms, and most preferably 1 to 6 carbon atoms, and may have pendant alkyl groups of 1 to 6 carbon atoms, and especially 1 to 4 carbon atoms.

S, T, and U are each integers from 0 to 20, preferably from 1 to 10, and more preferably from 1 to 8.

Illustrative examples of the compounds of formulas (19) and (20) include tris{2-(methoxymethoxy)ethyl}amine, tris{2-(methoxyethoxy)ethyl}amine, tris[2-{(2-methoxyethoxy)methoxy}ethyl]amine, tris{2-(2-methoxyethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5, and 1-aza-18-crown-6. Especially preferred basic compounds are tertiary amines, aniline derivatives, pyrrolidine derivatives, pyridine derivatives, quinoline derivatives, amino acid derivatives, hydroxyl group-bearing nitrogenous compounds, hydroxyphenyl group-bearing nitrogenous compounds, alcoholic nitrogenous compounds, amide derivatives, imide derivatives, tris{2-(methoxymethoxy)ethyl}amine, tris{2-(2-methoxyethoxy)ethyl}amine, tris[2-{(2-methoxyethoxy)-methyl}ethyl]amine, and 1-aza-15-crown-5.

The above-described basic compound may be used singly or in combinations of two or more thereof, and is preferably formulated in an amount of about 0.01 to 2 parts, and especially about 0.01 to 1 part by weight, per 100 parts by weight of the base resin. At less than 0.01 part, the desired effects of the basic compound may not be apparent, while the use of more than 2 parts may result in too low a sensitivity.

Dissolution Inhibitor (E)

The dissolution inhibitor (E) is a compound with a molecular weight of less than about 2,000 which changes its solubility in an alkaline developer under the action of an acid. Typically, a compound obtained by partially or entirely substituting acid labile substituents on a phenol or carboxylic acid derivative having a molecular weight of less than about 1,500 is added as the dissolution inhibitor.

Examples of the phenol or carboxylic acid derivative having a molecular weight of less than about 1,500 include 4,4'-(1-methylethylidene)bisphenol, (1,1'-biphenyl-4,4'-diol)-2,2'-methylenebis(4-methylphenol), 4,4-bis(4'-hydroxyphenyl)valeric acid, tris(4-hydroxyphenyl)methane, 1,1,1-tris(4'-hydroxyphenyl)ethane, 1,1,2-tris(4'-hydroxyphenyl)-ethane, phenolphthalein, thimolphthalein, 3,3'-difluoro[(1,1'-biphenyl)-4,4'-diol], 3,3',5,5'-tetrafluoro[(1,1'-biphenyl)-4,4'-diol], 4,4'-[2,2,2-trifluoro-1-(trifluoromethyl)ethylidene]bisphenol, 4,4'-methylenebis(2-fluorophenol), 2,2'-methylenebis(4-fluorophenol), 4,4'-isopropylidenebis(2-fluorophenol), cyclohexylidenebis(2-fluorophenol), 4,4'-[(4-fluorophenyl)methylene]bis(2-fluorophenol), 4,4'-methylenebis(2,6-difluorophenol), 4,4'-(4-fluorophenyl)methylenebis(2,6-difluorophenol), 2,6-bis[(2-hydroxy-5-fluorophenyl)methyl]-4-fluorophenol, 2,6-bis[(4-hydroxy-3-fluorophenyl)methyl]-4-fluorophenol, and 2,4-bis[(3-hydroxy-4-hydroxyphenyl)methyl]-6-methylphenol. The acid labile substituents are the same as illustrated above.

An appropriate amount of the dissolution inhibitor (E) is 0 to about 10 parts, and especially 0 to about 5 parts by weight per 100 parts by weight of the base resin.

The resist composition of the invention may include, as an optional ingredient, a surfactant which is commonly used for improving the coating characteristics. Such optional ingredients may be added in conventional amounts so long as this does not compromise the objects of the invention.

A nonionic surfactant is preferred, examples of which include perfluoroalkyl polyoxyethylene ethanols, fluorinated alkyl esters, perfluoroalkylamine oxides, and fluorinated organosiloxane compounds. Illustrative examples include Florade FC-430 and FC-431 from Sumitomo 3M Ltd., Surflon S-141, S-145, S-381 and S-383 from Asahi Glass Co., Ltd., Unidyne DS-401, DS-403, and DS-451 from Daikin Industries Ltd., Megaface F-8151, F-171, F-172, F-173 and F-177 from Dainippon Ink & Chemicals, Inc., and X-70-092 and X-70-093 from Shin-Etsu Chemical Co., Ltd. Preferred surfactants include Florade FC-430 from Sumitomo 3M Ltd. and X-70-093 from Shin-Etsu Chemical Co., Ltd.

Pattern formation using the resist composition of the invention may be carried out by a known lithographic technique. For example, on a substrate, typically a synthetic quartz substrate having a chromium film deposited thereon by sputtering, the resist composition is applied by spin coating or the like to form a resist film having a thickness of 0.1 to 1.0 μm. The film is then pre-baked on a hot plate or in an oven at 60 to 200° C. for 10 seconds to 60 minutes, and preferably at 80 to 150° C. for ½ to 5 minutes on the hot plate or for 5 to 30 minutes in the oven. The film is exposed to an electron beam in an exposure dose of about 1 to 200 μC., preferably about 2 to 50 μC., for defining the desired pattern. Thereafter, the film is post-exposure baked (PEB) on a hot plate or in an oven at 60 to 200° C. for 10 seconds to 60 minutes, and preferably at 80 to 150° C. for ½ to 5 minutes on the hot plate. Finally, development is carried out using as the developer an aqueous alkali solution, such as 0.1 to 5%, and preferably 2 to 3%, tetramethylammonium hydroxide (TMAH), this being done by a conventional method such as dipping, puddling, or spraying for a period of 10 seconds to 3 minutes, and preferably 30 seconds to 2 minutes. These steps result in the formation of the desired pattern on the substrate.

There has been described a resist composition which is suited for exposure to electron beams or soft x-rays, remains stable during vacuum standing after exposure, leaves minimal footings on chromium substrates, and has an excellent sensitivity, resolution, and plasma etching resistance. On account of these advantages, the resist composition is especially suited as a micropatterning material for use in the processing of mask substrates.

EXAMPLE

Examples of the invention are given below by way of illustration and not by way of limitation. The abbreviations used herein are Mw for weight average molecular weight, and Mn for number average molecular weight.

(1) Preparation of Resist Solution

A series of resist solutions were prepared by thoroughly mixing a polymer (Polymers 1 to 16), a photoacid generator (PAG1 and 2), a dissolution inhibitor (DRI1), and a basic compound, all shown below, in 800 parts by weight of a solvent mixture of propylene glycol monomethyl ether acetate (PGMEA) and ethyl lactate (EL) in a weight ratio of 1:1 to which 300 ppm of fluorochemical surfactant FC-430 (Sumitomo 3M Co., Ltd.) was added, followed by filtration through a high-density polyethylene filter with a pore size of 0.1 μm.

(2) Pattern Exposure Evaluation

Using CFS-4ES (Shibaura Mfg. Co., Ltd.), a chromium film of 100 nm thick was deposited on a synthetic quartz wafer having a diameter of 6 inches, by sputtering. Using Clean Track Mark 5 (Tokyo Electron Co., Ltd.), the resist was spin coated onto the substrate. This was followed by pre-baking on a hot plate at 100° C. for 90 seconds, forming a resist film of 500 nm thick. Using an EB lithography system (Erionics Co.), the resist film was subjected to pattern exposure in a vacuum chamber at a HV voltage of 30 keV and a beam current of 0.1 A.

Immediately after the pattern exposure, post-exposure baking (PEB) was effected on a hot plate at 110° C. for 90 seconds, using Clean Track Mark 5 (Tokyo Electron Co., Ltd.). This was followed by puddle development with an aqueous solution of 2.38 wt % TMAH for 60 seconds, yielding a positive pattern.

Another resist film sample was allowed to stand for 24 hours in the vacuum chamber of the lithography system after the pattern exposure, and thereafter subjected to PEB and development as above.

The pattern feature size was measured using a dimension measurement SEM S-7200 (Hitachi Ltd.). The pattern obtained as above was evaluated as follows. The optimal exposure dose (sensitivity, Eopt) was defined as the dose which provided a 0.8 μm line-and-space pattern as desired. The wafer processed at the optimal dose was cut to give a resist cross section for observation, on which a size of footing was measured. Similar measurement was done on the vacuum stood sample processed at the Eopt for the sample without vacuum standing.

The results are shown in Tables 1 and 2.

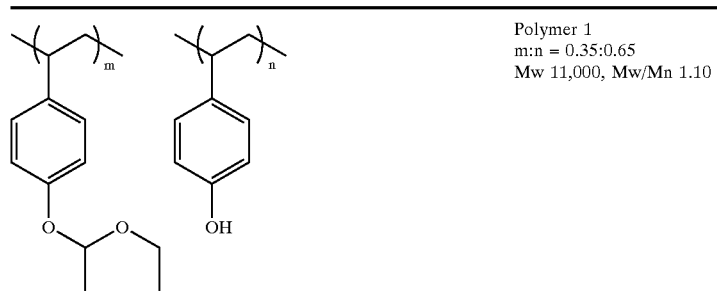
Polymer 1
m:n = 0.35:0.65
Mw 11,000, Mw/Mn 1.10
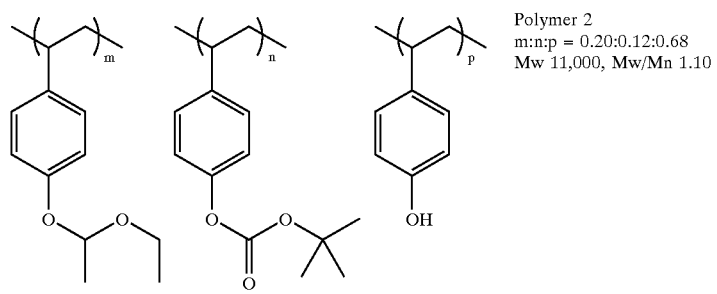
Polymer 2
m:n:p = 0.20:0.12:0.68
Mw 11,000, Mw/Mn 1.10
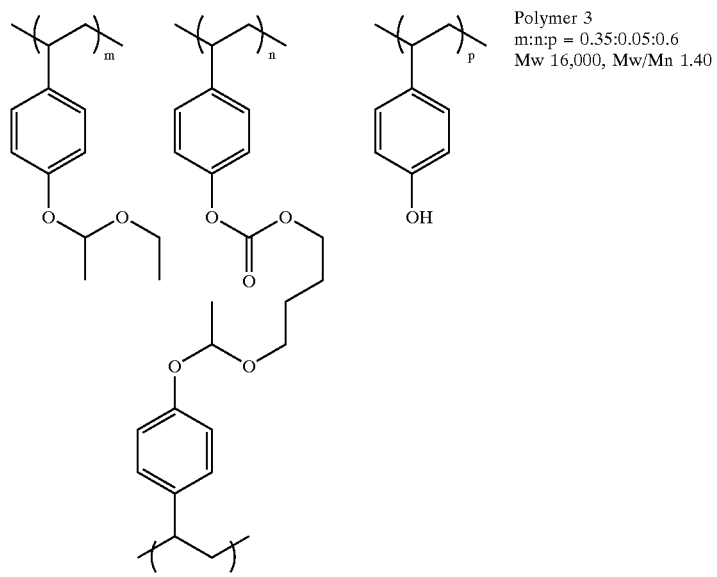
Polymer 3
m:n:p = 0.35:0.05:0.6
Mw 16,000, Mw/Mn 1.40
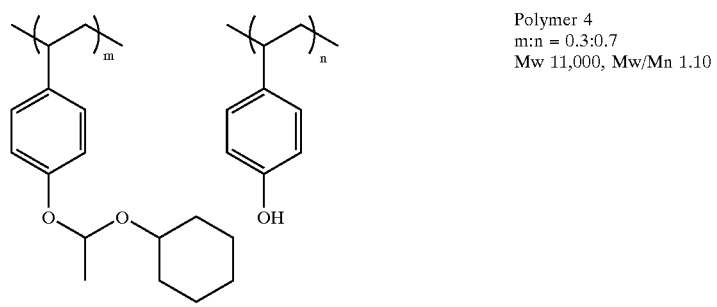
Polymer 4
m:n = 0.3:0.7
Mw 11,000, Mw/Mn 1.10

-continued
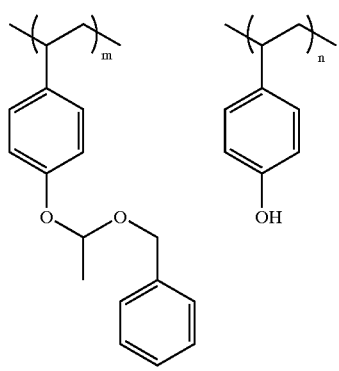
Polymer 5
m:n = 0.3:0.7
Mw 11,000, Mw/Mn 1.10
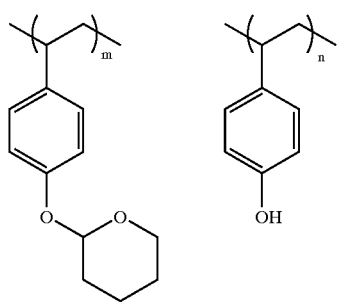
Polymer 6
m:n = 0.3:0.7
Mw 11,000, Mw/Mn 1.10
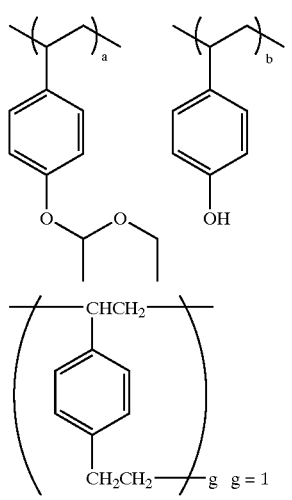
Polymer 7
Number of branches 3
a:b = 0.3:0.7
Mw 11,000, Mw/Mn 1.20
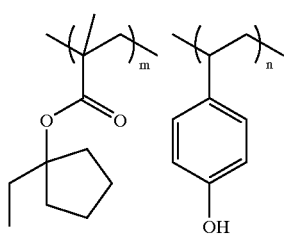
Polymer 8
m:n = 0.3:0.7
Mw 13,000, Mw/Mn 1.68

-continued
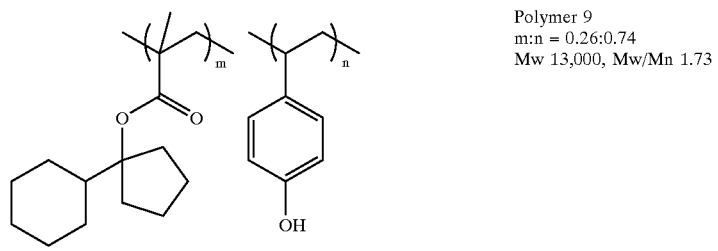
Polymer 9
m:n = 0.26:0.74
Mw 13,000, Mw/Mn 1.73
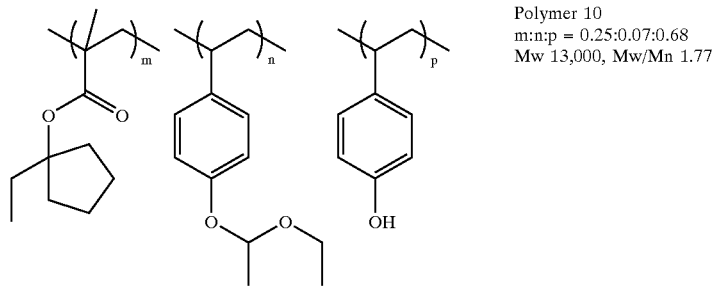
Polymer 10
m:n:p = 0.25:0.07:0.68
Mw 13,000, Mw/Mn 1.77
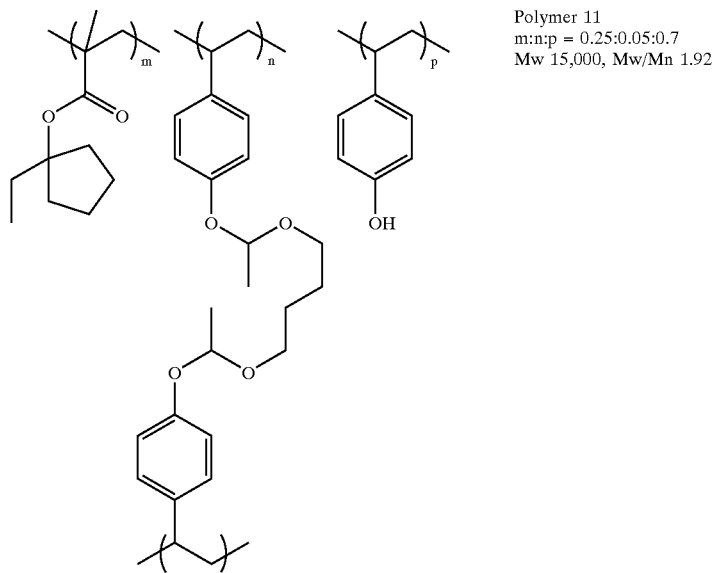
Polymer 11
m:n:p = 0.25:0.05:0.7
Mw 15,000, Mw/Mn 1.92
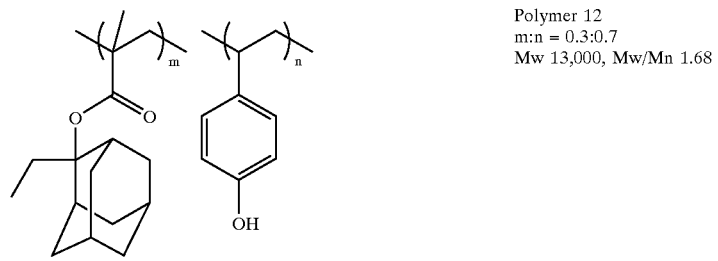
Polymer 12
m:n = 0.3:0.7
Mw 13,000, Mw/Mn 1.68
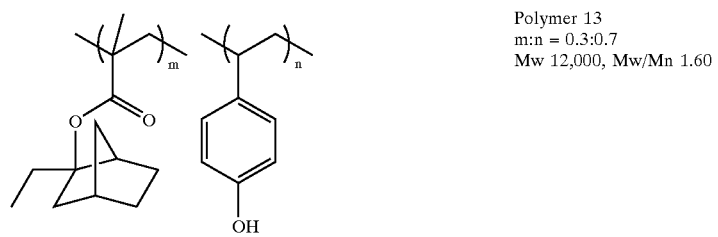
Polymer 13
m:n = 0.3:0.7
Mw 12,000, Mw/Mn 1.60

-continued
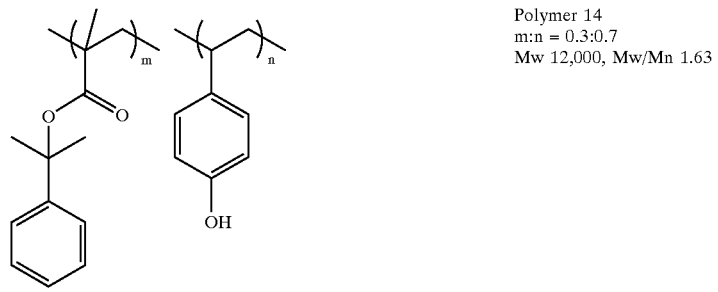
Polymer 14
m:n = 0.3:0.7
Mw 12,000, Mw/Mn 1.63
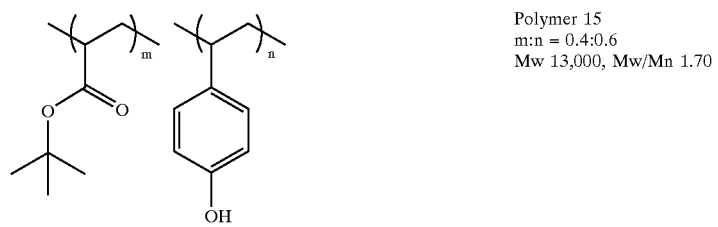
Polymer 15
m:n = 0.4:0.6
Mw 13,000, Mw/Mn 1.70
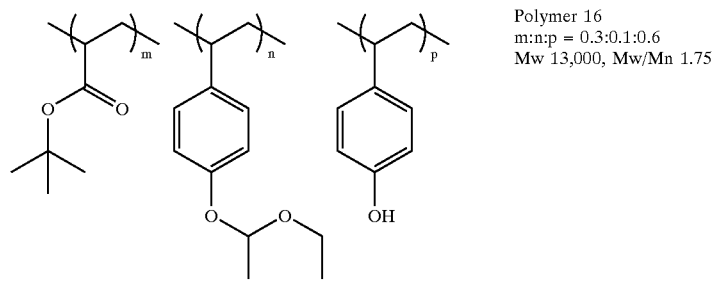
Polymer 16
m:n:p = 0.3:0.1:0.6
Mw 13,000, Mw/Mn 1.75
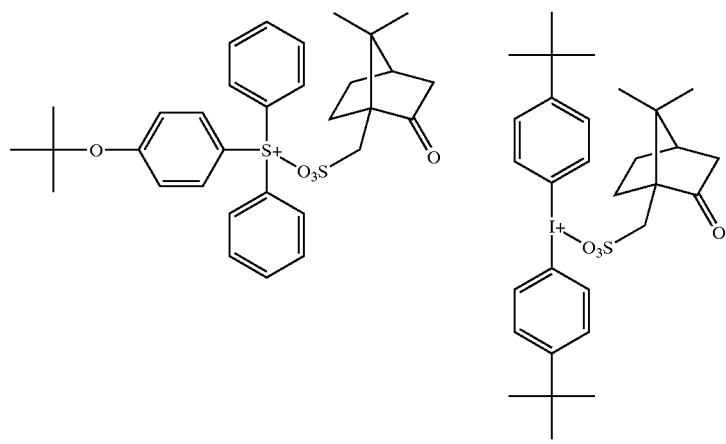
PAG1        PAG2
DRI 1
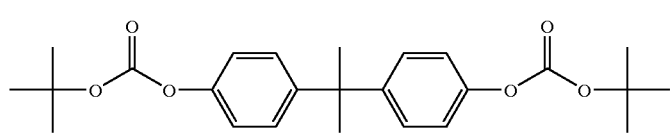

-continued

TMMEA

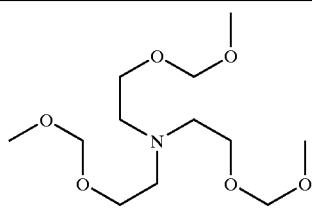

TEA: triethanolamine

TABLE 1

[Examples]

| Polymer (pbw) | Photoacid generator (pbw) | Base (pbw) | Dissolution inhibitor (pbw) | Sensitivity (μC) | Footing (nm) | Vacuum PED (nm) |
|---|---|---|---|---|---|---|
| Polymer 1 (15) Polymer 8 (85) | PAG1 (4) | TEA (0.1) | — | 7 | 10 | +10 |
| Polymer 2 (20) Polymer 8 (80) | PAG1 (4) | TEA (0.1) | — | 6 | 15 | +6 |
| Polymer 3 (17) Polymer 8 (73) | PAG1 (4) | TEA (0.1) | — | 6.5 | 10 | +5 |
| Polymer 4 (20) Polymer 8 (80) | PAG1 (4) | TEA (0.1) | — | 8 | 14 | −6 |
| Polymer 5 (20) Polymer 8 (80) | PAG1 (4) | TEA (0.1) | — | 8.5 | 16 | −7 |
| Polymer 6 (30) Polymer 8 (70) | PAG1 (4) | TEA (0.1) | — | 9.0 | 18 | −10 |
| Polymer 7 (15) Polymer 8 (85) | PAG1 (4) | TEA (0.1) | — | 7.0 | 10 | +8 |
| Polymer 3 (20) Polymer 9 (80) | PAG1 (4) | TEA (0.1) | — | 6 | 8 | −5 |
| Polymer 10 (100) | PAG1 (4) | TEA (0.1) | — | 7 | 12 | +12 |
| Polymer 5 (10) Polymer 11 (90) | PAG1 (4) | TEA (0.1) | — | 6 | 10 | +6 |
| Polymer 5 (10) Polymer 11 (90) | PAG1 (4) | TMMEA (0.2) | — | 7 | 8 | +5 |
| Polymer 5 (10) Polymer 11 (90) | PAG2 (4) | TEA (0.1) | — | 2 | 15 | +16 |
| Polymer 5 (25) Polymer 12 (75) | PAG1 (4) | TEA (0.1) | — | 8 | 20 | +5 |
| Polymer 5 (25) Polymer 13 (75) | PAG1 (4) | TEA (0.1) | — | 6 | 10 | +5 |
| Polymer 5 (25) Polymer 14 (75) | PAG1 (4) | TEA (0.1) | — | 7 | 13 | +17 |
| Polymer 5 (25) Polymer 14 (75) | PAG1 (4) | TEA (0.1) | DRI1 | 6 | 15 | +16 |

TABLE 2

[Comparative Examples]

| Polymer (pbw) | Photoacid generator (pbw) | Base (pbw) | Dissolution inhibitor (pbw) | Sensitivity (μC) | Footing (nm) | Vacuum PED (nm) |
|---|---|---|---|---|---|---|
| Polymer 1 (100) | PAG1 (4) | TEA (0.1) | — | 6 | 10 | +123 |
| Polymer 2 (100) | PAG1 (4) | TEA (0.1) | — | 6.5 | 13 | +85 |
| Polymer 3 (100) | PAG1 (4) | TEA (0.1) | — | 6.5 | 8 | +88 |
| Polymer 4 (100) | PAG1 (4) | TEA (0.1) | — | 8 | 12 | +55 |
| Polymer 5 (100) | PAG1 (4) | TEA (0.1) | — | 8 | 12 | +40 |
| Polymer 6 (100) | PAG1 (4) | TEA (0.1) | — | 8 | 16 | +44 |
| Polymer 7 (20) | PAG1 (4) | TEA (0.1) | — | 7 | 10 | +126 |

TABLE 2-continued

[Comparative Examples]

| Polymer (pbw) | Photoacid generator (pbw) | Base (pbw) | Dissolution inhibitor (pbw) | Sensitivity ($\mu C$) | Footing (nm) | Vacuum PED (nm) |
|---|---|---|---|---|---|---|
| Polymer 8 (100) | PAG1 (4) | TEA (0.1) | — | 6.5 | 18 | −42 |
| Polymer 9 (100) | PAG1 (4) | TEA (0.1) | — | 6 | 13 | −77 |
| Polymer 11 (100) | PAG1 (4) | TEA (0.1) | — | 8 | 18 | −25 |
| Polymer 12 (100) | PAG1 (4) | TEA (0.1) | — | 8 | 24 | −30 |
| Polymer 13 (100) | PAG1 (4) | TEA (0.1) | — | 7 | 15 | −33 |
| Polymer 14 (100) | PAG1 (4) | TEA (0.1) | — | 7 | 14 | −43 |
| Polymer 15 (100) | PAG1 (4) | TEA (0.1) | — | 16 | 55 | +10 |
| Polymer 16 (100) | PAG1 (4) | TEA (0.1) | — | 13 | 48 | −16 |

Japanese Patent Application No. 2000-218490 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A chemically amplified positive resist composition for forming a resist film on a substrate having a chromium film deposited thereon and for exposure to electron beam, comprising as a base polymer a resin having the following unit (A) soluble in aqueous alkaline solution, in which acid labile acetal or ketal groups of the following general formula (1)-1, (1)-2 or (1)-3 replace at least some of the hydrogen atoms on the phenolic hydroxyl groups of the unit (A) so that the resin becomes insoluble or substantially insoluble in alkali, and as another base polymer a resin having the following unit (B) soluble in aqueous alkaline solution, in which acid labile tertiary hydrocarbon groups of the following general formula (2)-1 replace at least some of the hydrogen atoms of the carboxyl groups of the unit (B) so that the resin becomes insoluble or substantially insoluble in alkali:

(A)

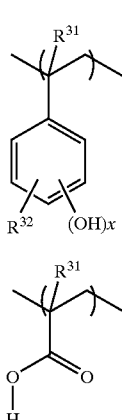

(B)

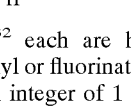

wherein $R^{31}$ and $R^{32}$ each are hydrogen or a straight, branched or cyclic alkyl or fluorinated alkyl group of 1 to 10 carbon atoms; x is an integer of 1 to 4;

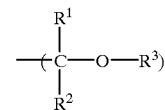

(1)-1 wherein $R^1$ and $R^2$ each are hydrogen or a straight, branched or cyclic alkyl group of 1 to 20 carbon atoms, which may contain a hetero atom, $R^3$ is a straight, branched or cyclic alky group of 1 to 20 carbon atoms or aryl or aralkyl group of 6 to 20 carbon atoms, which may contain a hetero atom, or a pair of $R^1$ and $R^2$, $R^1$ and $R^3$, or $R^2$ and $R^3$, taken together, may form a ring;

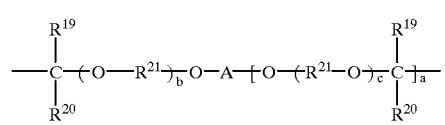

(1)-2

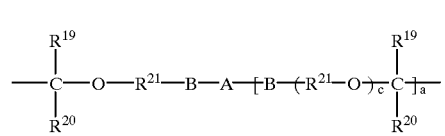

(1)-3 wherein $R^{19}$ and $R^{20}$ each are hydrogen or a straight, branched or cyclic alkyl group of 1 to 8 carbon atoms, or $R^{19}$ and $R^{20}$, taken together, may form a ring, and $R^{19}$ and $R^{20}$ are straight or branched alkylene groups of 1 to 8 carbon atoms when they form a ring; $R^{21}$ is a straight, brached or cyclic alkylene group of 1 to 10 carbon atoms; "b" and "c" are 0 or integers of 1 to 10; A is a (a+1)-valent aliphatic or alicyclic saturated hydrocarbon group, aromatic hydrocarbon group or heterocyclic group having 1 to 50 carbon atoms, which may be separated by a hetero atom or in which some of the hydrogen atoms attached to carbon atoms may be substituted with hydroxyl, carboxyl, carbonyl or fluorine; B is —CO—O—, —NHCO—O— or —NHCONH—, and "a" is an integer of 1 to 7;

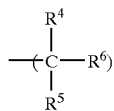
(2)-1 wherein $R^4$ to $R^6$ each are a straight, branched or cyclic alkyl group of 1 to 20 carbon atoms or aryl group of 6 to 20 carbon atoms, at least one of $R^4$, $R^5$ and $R^6$ is a cyclic alkyl group of 5 to 20 carbon atoms or aryl group of 6 to 20 carbon atoms, which may contain a hetero atom or a pair of $R^4$, $R^5$ and $R^6$, taken together, may form a ring of 5 to 30 carbon atoms, which may contain hetero atom, the total number of carbon atoms in $R^4$, $R^5$ and $R^6$ together is from 6 to 30.

2. A composition according to claim 1, further comprising an organic solvent, a photo acid generator, a basic compound, a dissolution inhibitor, or a combination thereof.

3. A composition according to claim 1, wherein $R^4$, $R^5$ and $R^6$, taken together, form a ring of the formula:

(4)-1

(4)-2
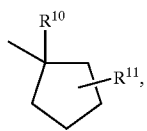

(4)-3

(4)-4
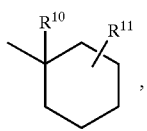

(4)-6
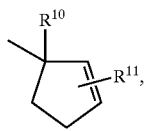

(4)-7
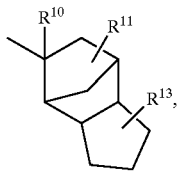

(4)-8
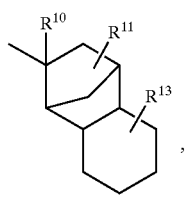

(4)-9
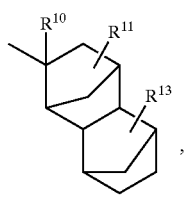

(4)-10
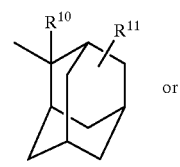 or (4)-11
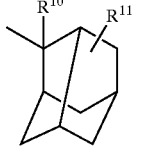

wherein $R^{10}$ which may be the same or different is a straight, branched or cyclic alkyl group of 1 to 8 carbon atoms or aryl group of 6 to 20 carbon atoms, and $R^{11}$ and $R^{13}$ each are hydrogen or a straight, branched or cyclic alkyl group of 1 to 20 carbon atoms.

4. A composition according to claim 1, wherein the hetero atom of $R^1$–$R^6$ is, independently, oxygen, sulfur, nitrogen or fluorine.

5. A composition according to claim 1, wherein $R^3$ is a straight, branched or cyclic alkyl group of 1 to 20 carbon atoms or an aryl group of 6 to 20 carbon atoms, which may contain a hetero atom.

* * * * *